(12) United States Patent
Usujima et al.

(10) Patent No.: US 8,237,219 B2
(45) Date of Patent: Aug. 7, 2012

(54) SEMICONDUCTOR DEVICE AND METHOD OF MANUFACTURING SAME

(75) Inventors: Akihiro Usujima, Yokohama (JP); Shigeo Satoh, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 76 days.

(21) Appl. No.: 12/877,882

(22) Filed: Sep. 8, 2010

(65) Prior Publication Data

US 2011/0057253 A1     Mar. 10, 2011

(30) Foreign Application Priority Data

Sep. 9, 2009   (JP) ................. 2009-208306

(51) Int. Cl.
*H01L 27/088* (2006.01)
*H01L 29/78* (2006.01)
*H01L 21/336* (2006.01)

(52) U.S. Cl. ........... 257/327; 257/288; 257/E21.409; 257/E27.061; 257/384; 438/527; 438/305

(58) Field of Classification Search .......... 257/327, 257/288, E21.409, 384, E27.061; 438/527, 438/305
See application file for complete search history.

(56) References Cited

U.S. PATENT DOCUMENTS

2011/0230039 A1*   9/2011   Mowry et al. .......... 438/527

FOREIGN PATENT DOCUMENTS

JP       2005-005372       1/2005

* cited by examiner

*Primary Examiner* — Cuong Q Nguyen
*Assistant Examiner* — Cathy N Lam
(74) *Attorney, Agent, or Firm* — Fujitsu Patent Center

(57) ABSTRACT

A semiconductor device includes a first transistor including a first source/drain region and a first sidewall spacer, and a second transistor including a second source/drain region and a second sidewall spacer, the first sidewall spacer has a first width and the second sidewall spacer has a second width wider than the first width, and the first source/drain region has a first area and the second source/drain region has a second area larger than the first area.

3 Claims, 24 Drawing Sheets

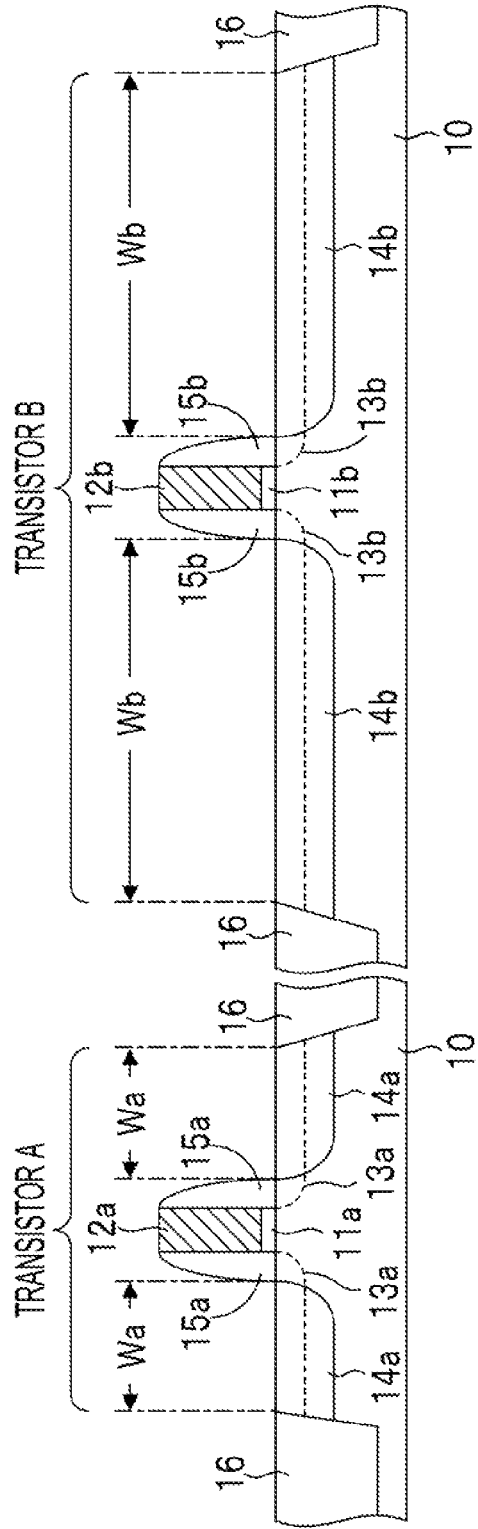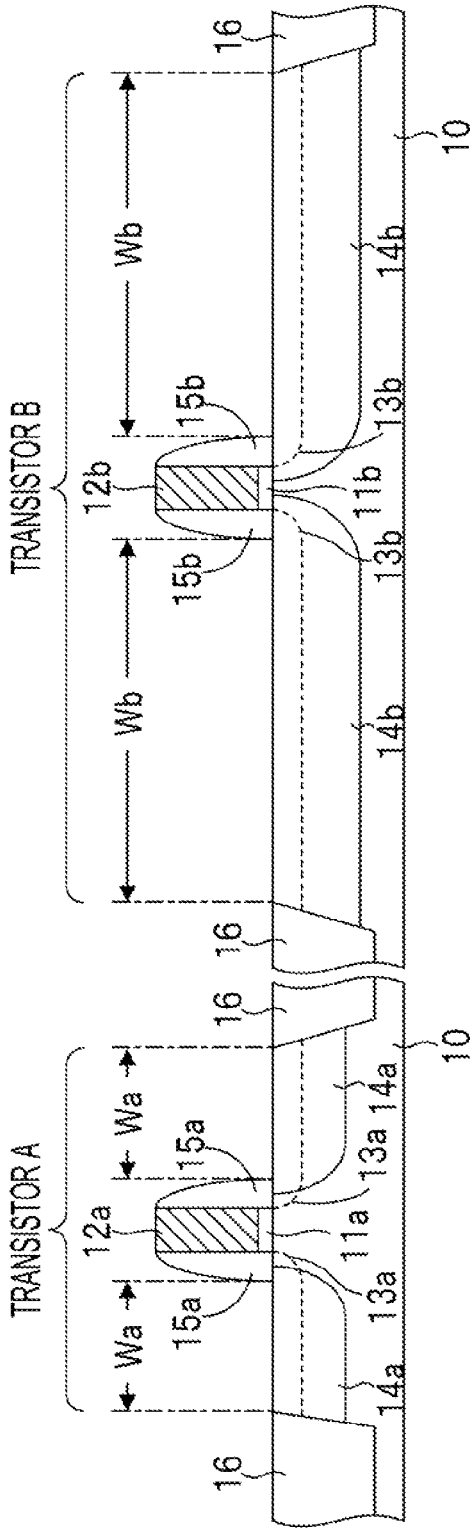

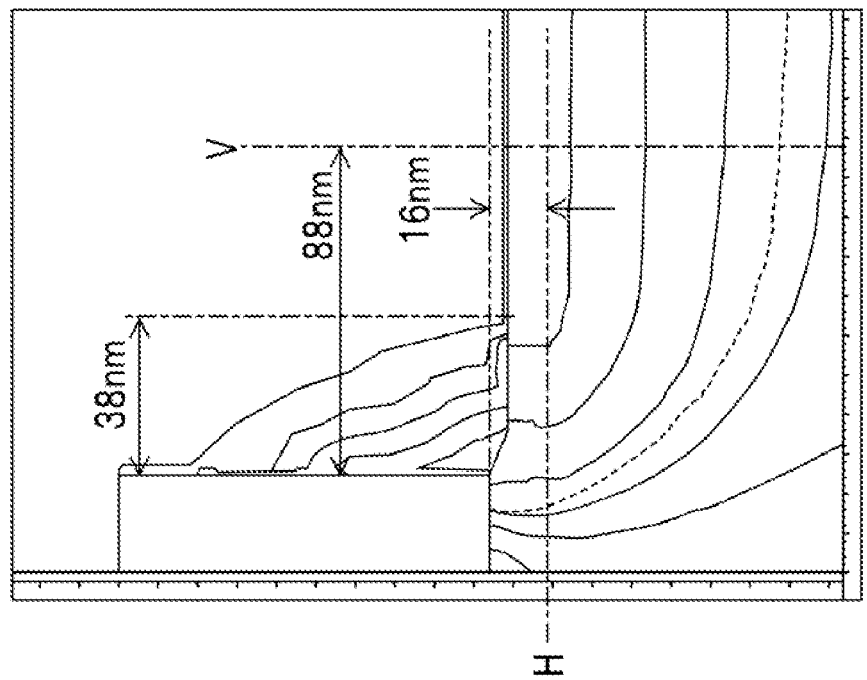
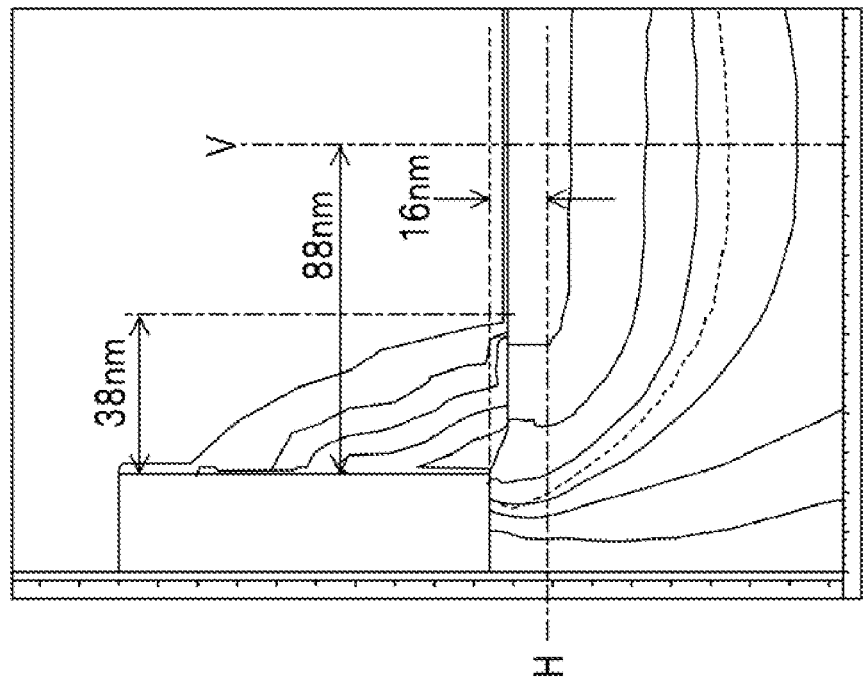

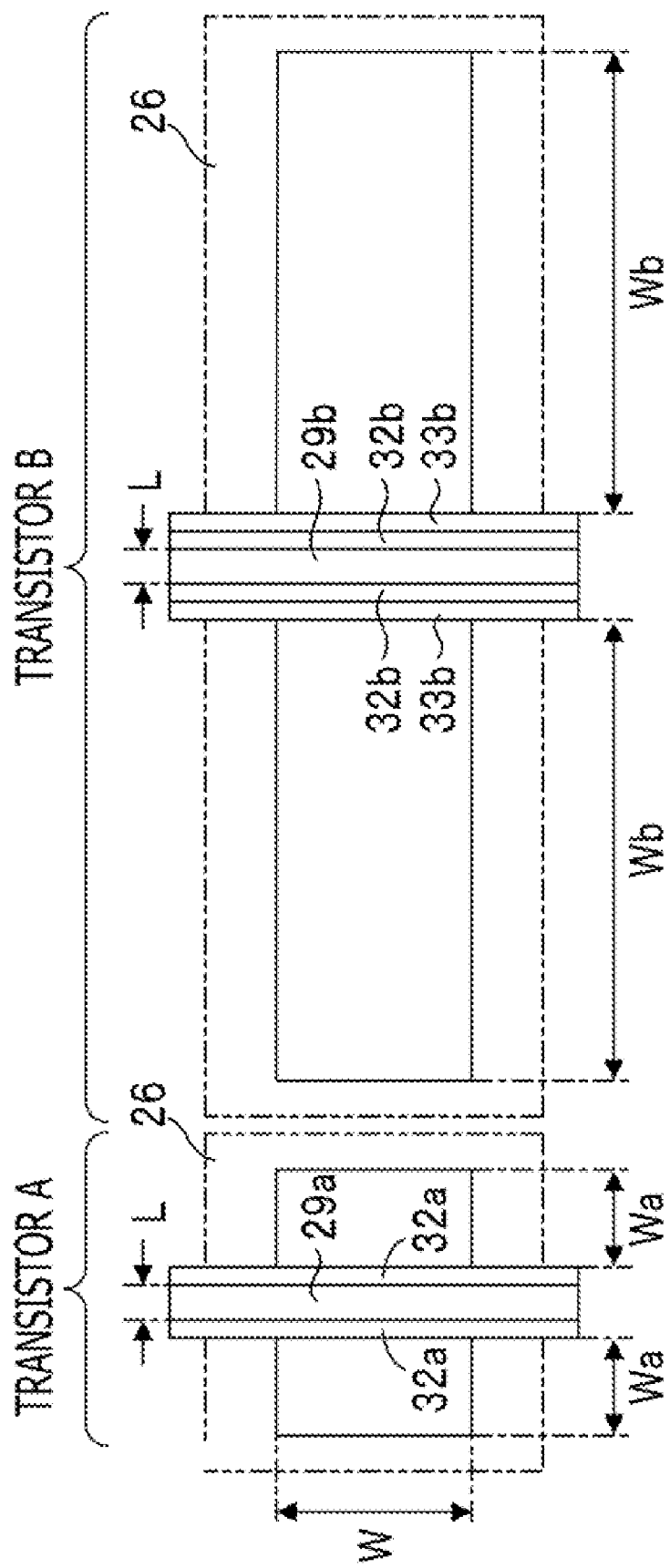

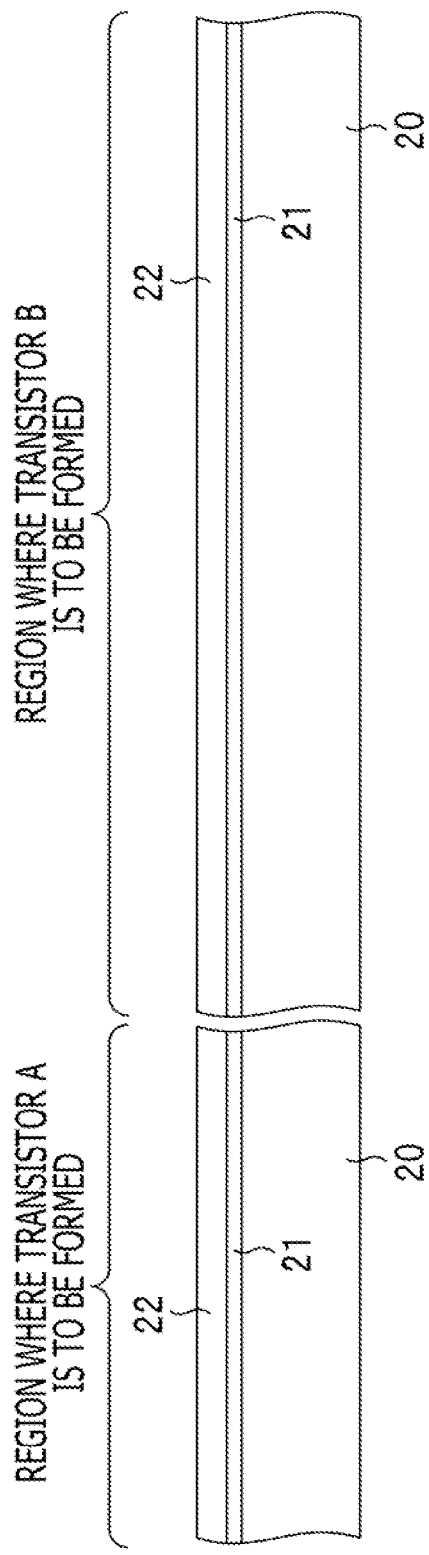
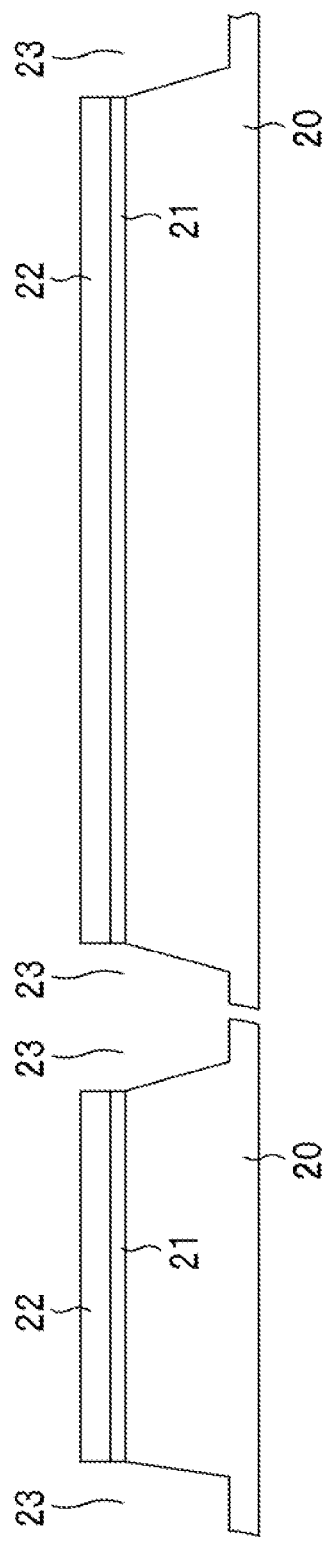

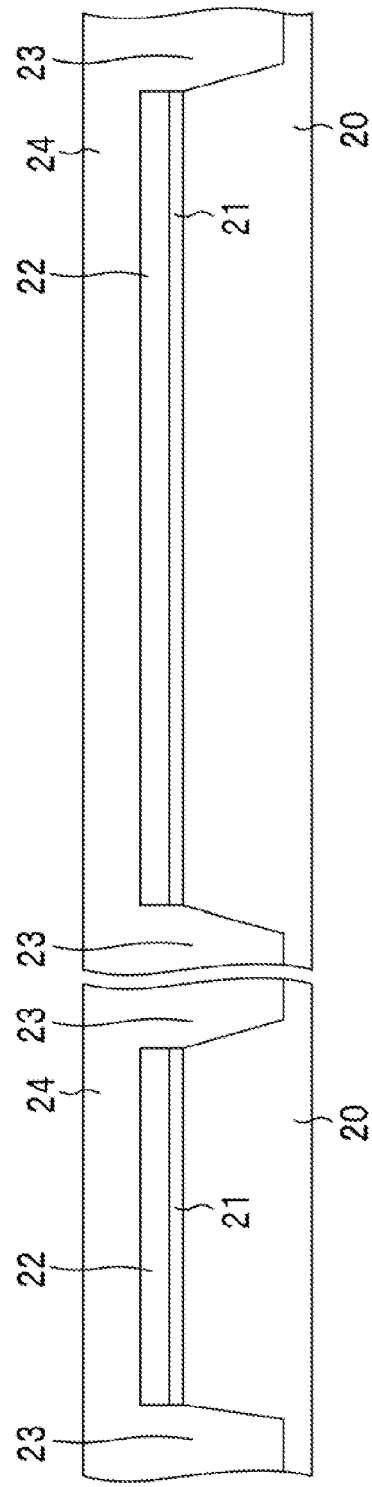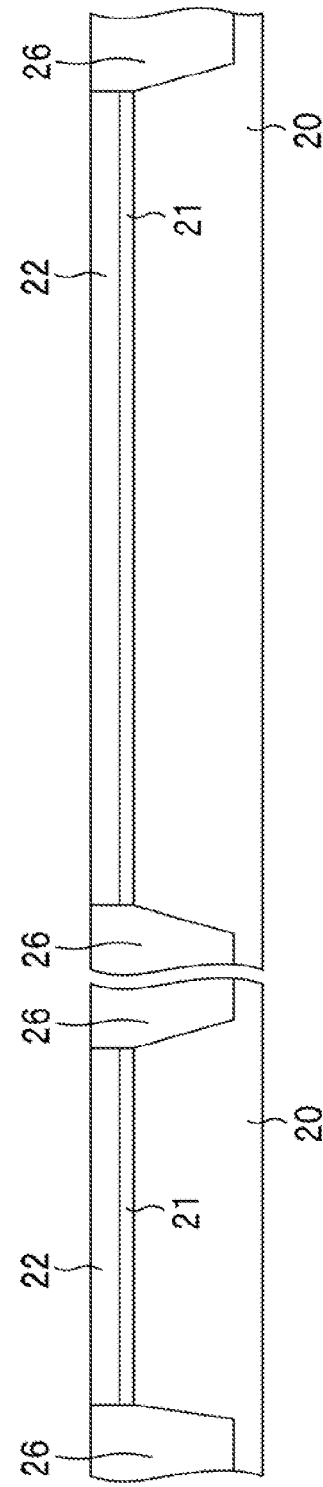

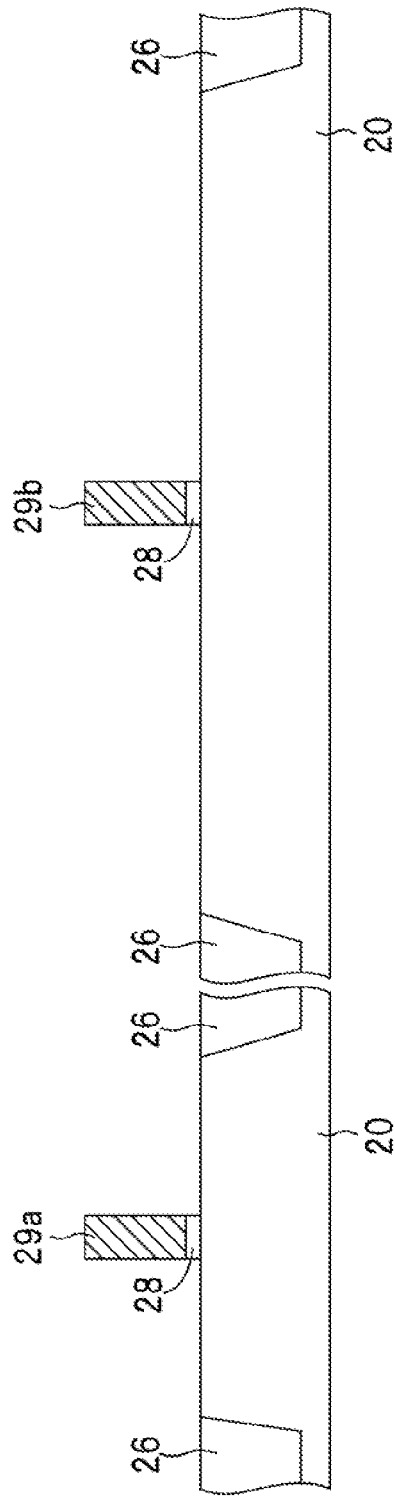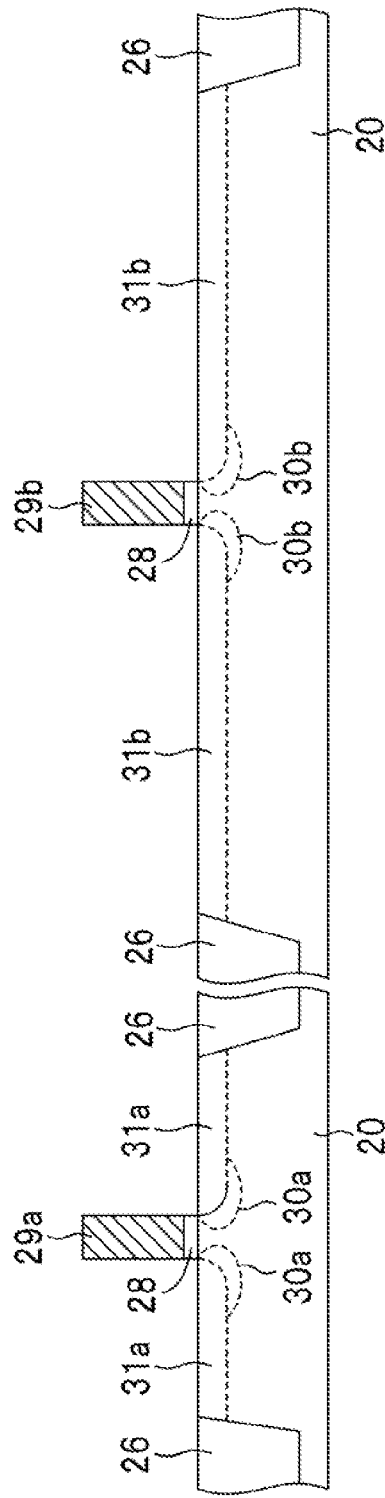

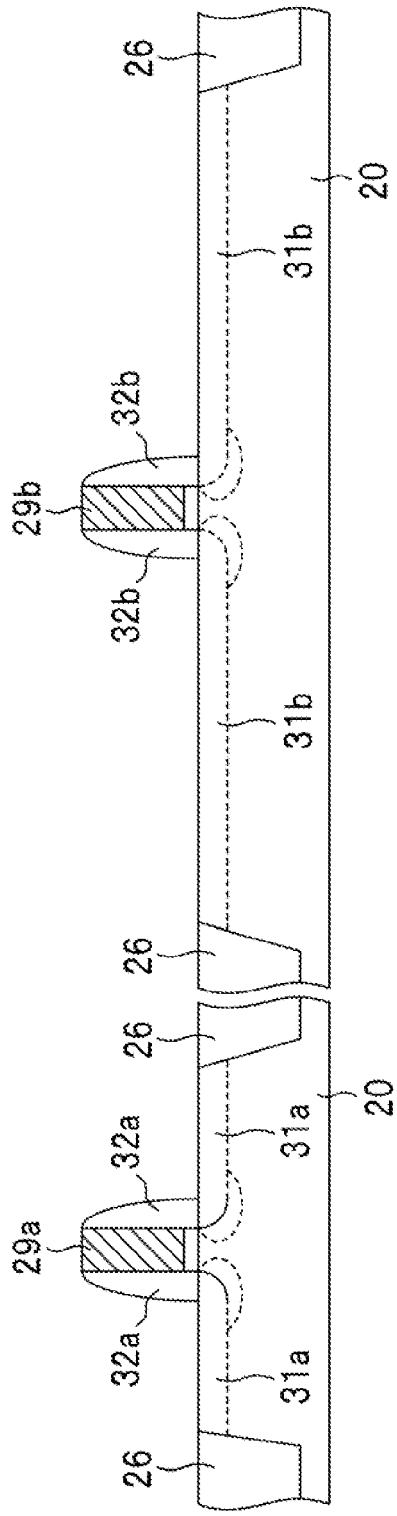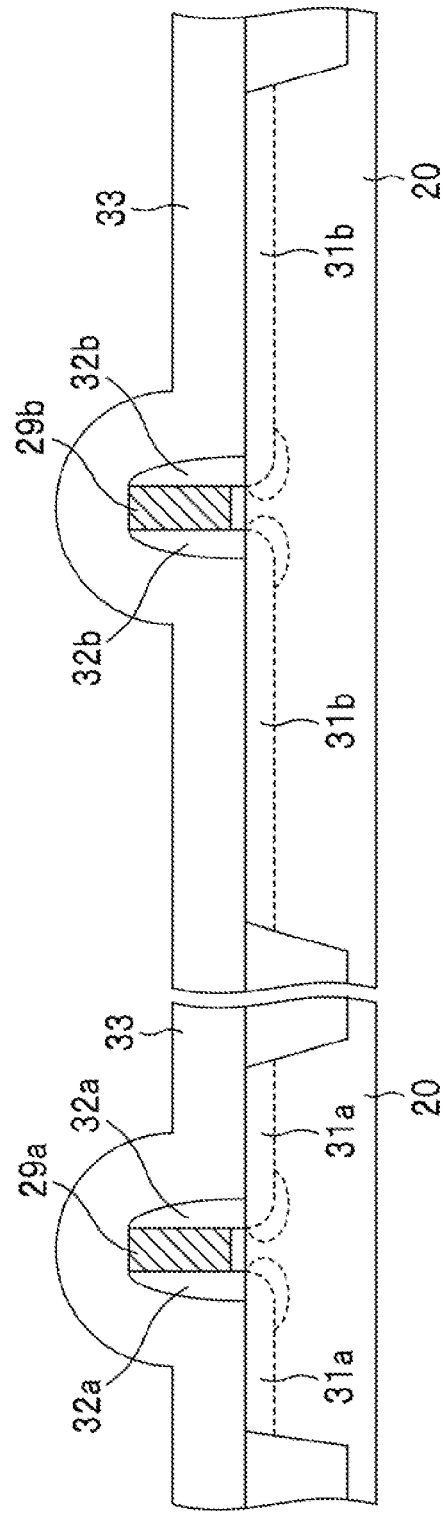

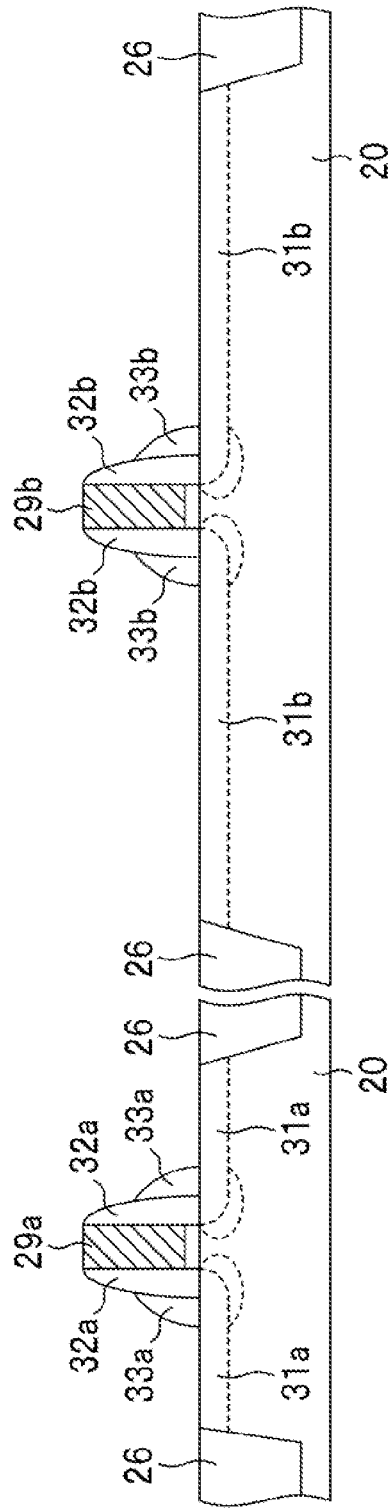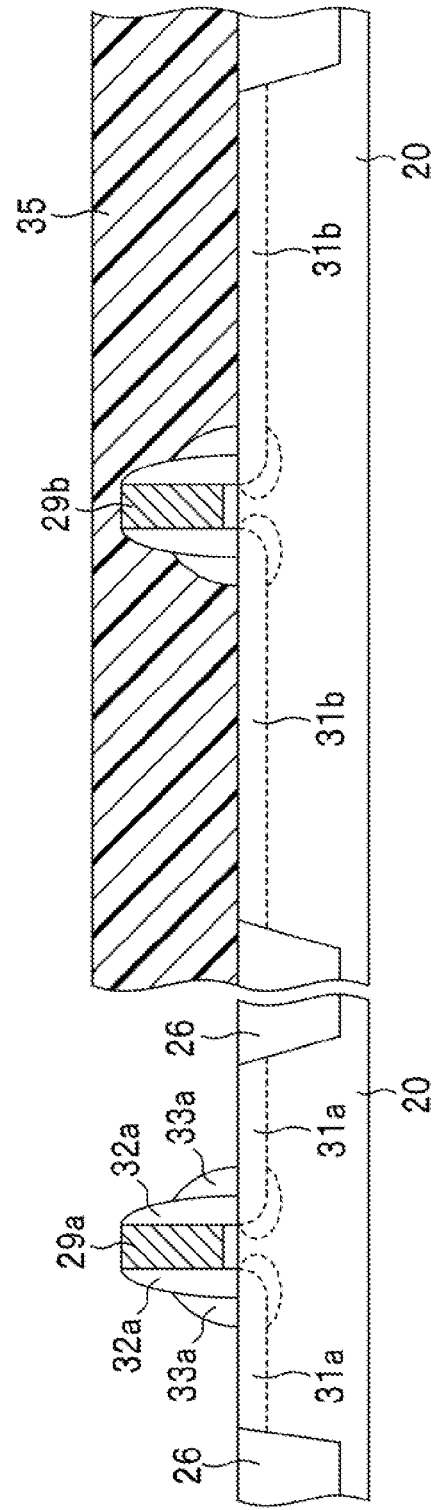

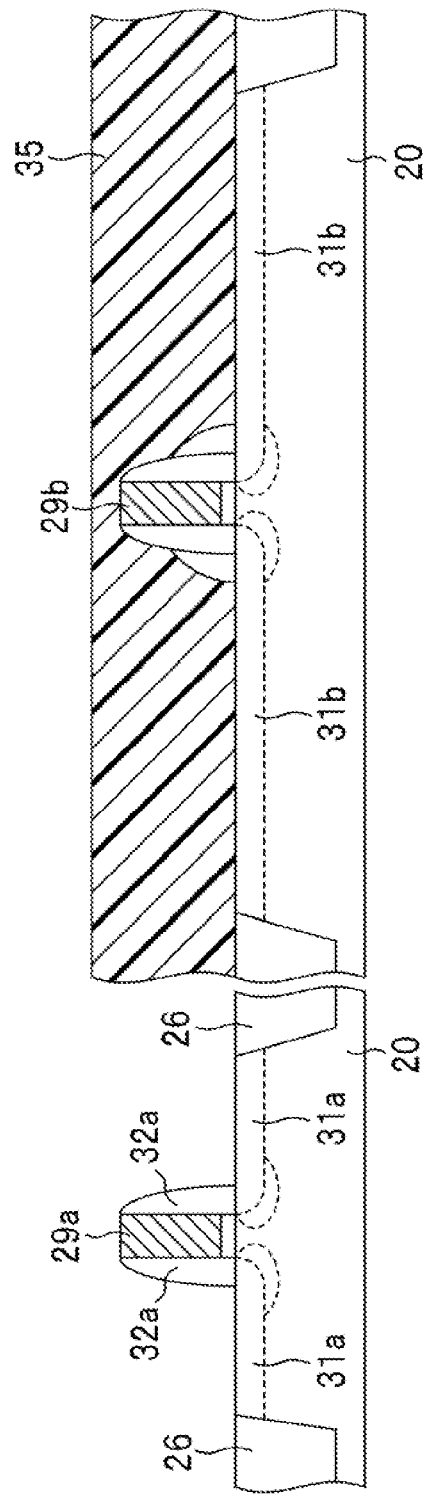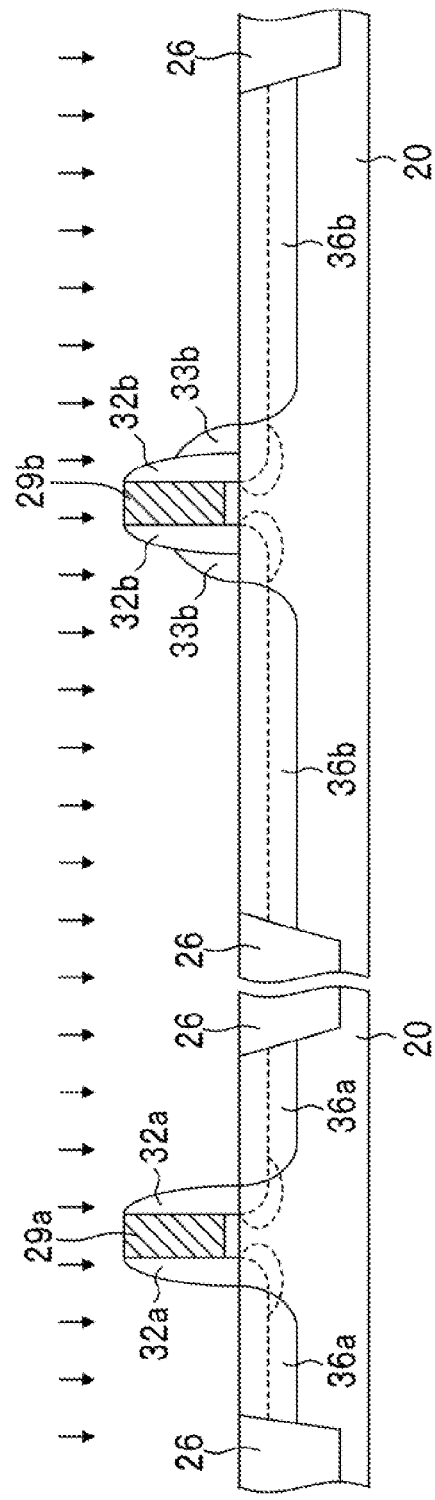

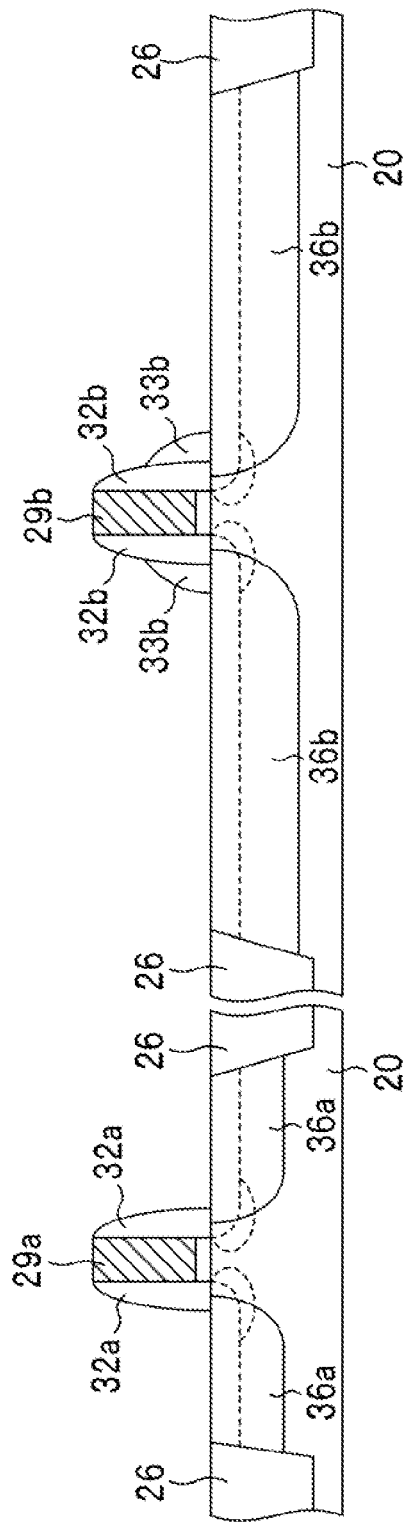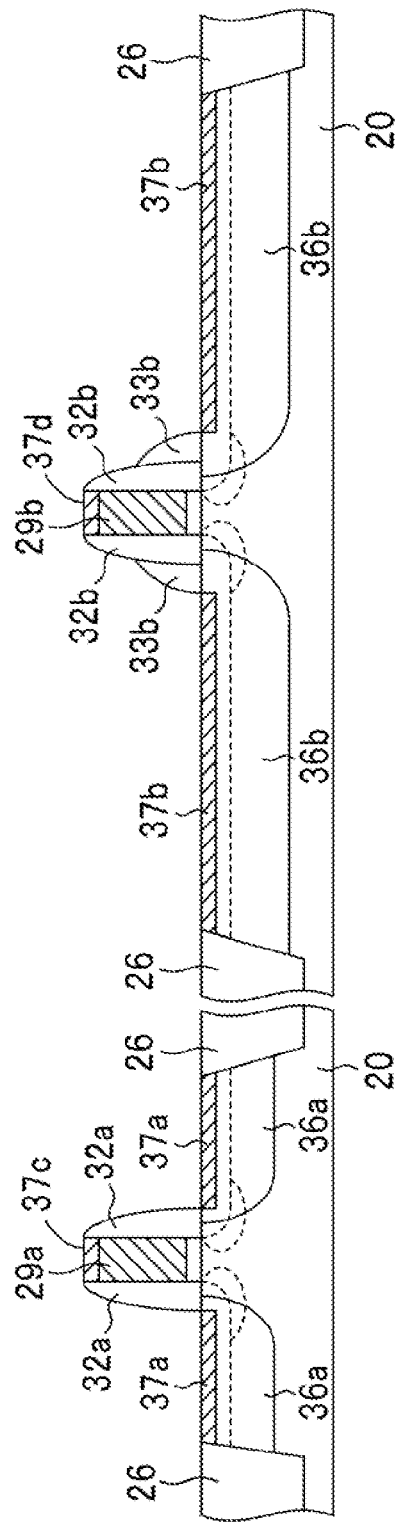

SEMICONDUCTOR DEVICE AND METHOD OF MANUFACTURING SAME

CROSS-REFERENCE TO RELATED APPLICATION

This application is based upon and claims the benefit of priority from the prior Japanese Patent Application No. 2009-208306, filed on Sep. 9, 2009, the entire contents of which is incorporated herein by reference.

FIELD

The embodiments discussed herein are related to a semiconductor device including a transistor, and to a method of manufacturing the semiconductor device.

BACKGROUND

In recent years, consumers have demanded that a semiconductor device have a higher packing density and higher performance, and those demands have increased the number of MOS transistors formed on a semiconductor substrate.

A general MOS transistor has impurity regions serving as a source and a drain (hereinafter referred to as "source and drain regions" or a "source/drain region" in a representative way), a channel region, and an extension region disposed at each end of the channel region. Such a MOS transistor is formed, for example, by the method described below.

A gate insulation film and a gate electrode are formed on a silicon semiconductor substrate. Extension regions are formed by ion-implanting impurities into the semiconductor substrate with the gate electrode being used as a mask. Sidewall spacers are formed on both sides of the gate electrode. The source and drain regions are formed by ion-implanting impurities into the semiconductor substrate at a higher concentration up to a depth deeper than the extension regions with the gate electrode and the sidewall spacers being used as masks. Heat treatment (thermal processing) is performed to activate the impurities having been introduced to the semiconductor substrate. A MOS transistor having the extension regions is completed in this way.

As described above, a heat treatment operation for activating the impurities (hereinafter also referred to as an "activation heat treatment" operation) is performed in a process of manufacturing the MOS transistor. In the heat treatment operation, the impurities implanted to the source and drain regions are diffused into the interior of the semiconductor substrate under the gate electrode such that the spacing between the source and the drain (hereinafter also referred to as the "channel length") is shortened. The shorter spacing between the source and the drain gives rise to the so-called channel shortening effect with which a threshold voltage is reduced. For that reason, the activation heat treatment is performed in a short time by using, e.g., the RTA (Rapid Thermal Annealing) process. Further, the thickness of each sidewall spacer is set to a value that is suitable to minimize the shorter channel effect caused by the diffusion of the impurities.

It is known that the diffusion distance of the impurities during the heat treatment operation is related to the impurity concentration. In view of such a point, a MOS transistor has been proposed in which the impurity concentration in the source is set higher than that in the drain and the thickness of the sidewall spacer on the same side as the source is increased to suppress an overlap between the source and the gate electrode, as disclosed in, e.g., Japanese Laid-Open Patent Publication No. 2005-5372.

SUMMARY

A semiconductor device includes a first transistor including a first source/drain region and a first sidewall spacer, and a second transistor including a second source/drain region and a second sidewall spacer, the first sidewall spacer has a first width and the second sidewall spacer has a second width wider than the first width, and the first source/drain region has a first area and the second source/drain region has a second area larger than the first area.

The object and advantages of the invention will be realized and attained by at least the feature, elements, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 1A is a sectional view of a semiconductor substrate before activation heat treatment;

FIG. 1B is a sectional view of the semiconductor substrate after the activation heat treatment;

FIG. 2A is a chart illustrating a simulation result of an impurity concentration profile in a transistor A after the heat treatment;

FIG. 2B is a chart illustrating a simulation result of an impurity concentration profile in a transistor B after the heat treatment;

FIG. 5 is a top plan view of a semiconductor device according to a first embodiment;

FIGS. 6A, 6B, 7A, 7B, 8A, 8B, 9A, 9B, 10A, 10B, 11A, 11B, 12A, 12B, 13A, 13B, and 14 are sectional views illustrating a method of manufacturing the semiconductor device according to the first embodiment;

DESCRIPTION OF EMBODIMENTS

Figure 3A:
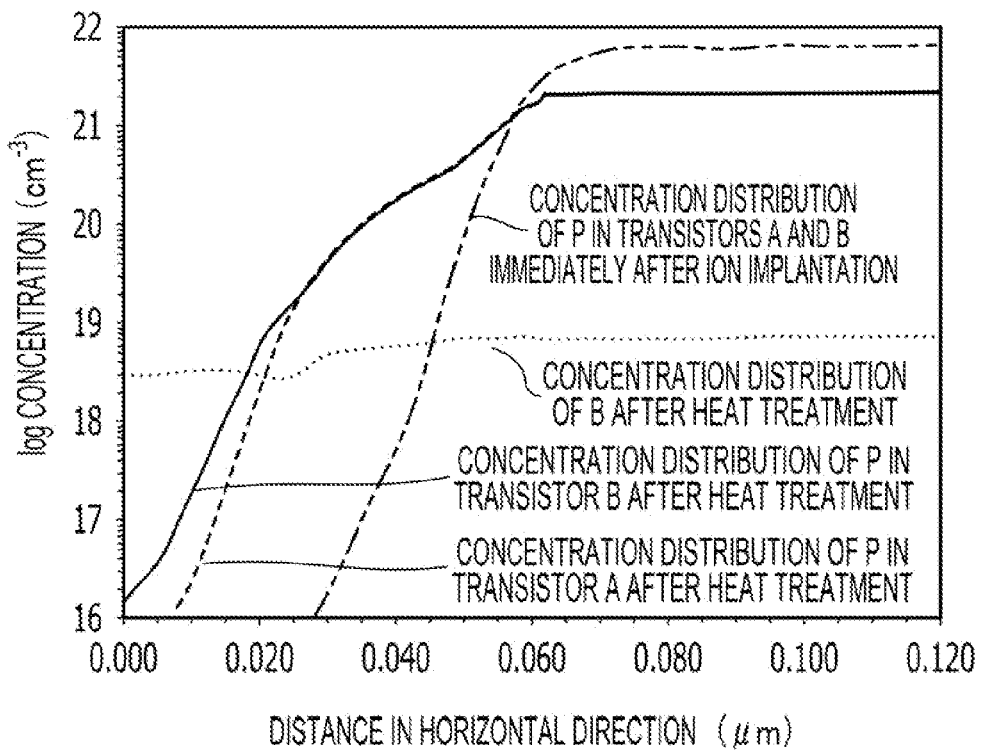
FIG. 3A is a graph illustrating impurity concentration distributions in the horizontal direction in the transistors A and B immediately after impurity implantation and after the activation heat treatment.

It has been generally thought that, if the impurity concentration is the same, the diffusion distance of impurities during heat treatment may also be the same. However, experiments and studies made by the inventors of this application have proved that, when an MOS transistor having a microstructure is formed, the amount (distance) of diffusion of impurities changes depending on the size of a source/drain region even with the same impurity concentration. As a result of such a phenomenon, the channel length changes depending on the size of the source/drain region even in the MOS transistor that has been manufactured under the same conditions.

When a transistor has a large gate length, e.g., a large width of a gate electrode, the difference in the amount of diffusion of impurities depending on different sizes of the source/drain region hardly causes a problem. However, when a transistor has a small gate length, an influence of change in the channel length caused by the difference in the size of the source/drain region is so large as to make characteristics, e.g., a threshold voltage, different between the transistor having the large source/drain region and the transistor having the small source/drain region.

For convenience in layout, for example, a semiconductor device includes a plurality of MOS transistors in which the sizes of their source/drain regions differ from each other. In an electronic circuit formed by using a plurality of MOS transistors, different characteristics of the MOS transistors may cause an operation failure.

FIG. 1A is a sectional view of a semiconductor substrate before activation heat treatment, and FIG. 1B is a sectional view of the semiconductor substrate after the activation heat treatment. In FIGS. 1A and 1B, the left side represents a MOS transistor having a smaller source/drain region (hereinafter referred to as a "transistor A"), and the right side represents a MOS transistor having a larger source/drain region (hereinafter referred to as a "transistor B").

In FIGS. 1A and 1B, reference numeral 10 denotes a semiconductor substrate, 11a and 11b denote gate insulation films, 12a and 12b denote gate electrodes, 13a and 13b denote extension regions, 14a and 14b denote source/drain regions, 15a and 15b denote sidewall spacers, and 16 denotes a device separation region. Further, in FIGS. 1A and 1B, the distance from the sidewall spacer 15a of the transistor A to the device separation region 16 is indicated by Wa, and the distance from the sidewall spacer 15b of the transistor B to the device separation region 16 is indicated by Wb. Wb is larger than Wa. Hereinafter, the distance from the sidewall spacer to the device separation region, e.g., the length of each of the source and the drain in a direction perpendicular to the gate electrode, is also called a "source/drain width".

As illustrated in FIG. 1A, in the state before the activation heat treatment, edges of the source/drain regions 14a and 14b are substantially coincident with outer edges of the sidewall spacers 15a and 15b. When the heat treatment is carried out in such a state, the edges of the source/drain regions 14a and 14b come closer respectively to the gate electrodes 13a and 13b due to diffusion of impurities, as illustrated in FIG. 1B.

When heat treatment conditions are set to be adapted for the transistor A, the diffusion distance of the impurities is increased in the transistor B and the spacing between the source and drain regions 14b, e.g., the channel length, is shortened.

Figure 3B:
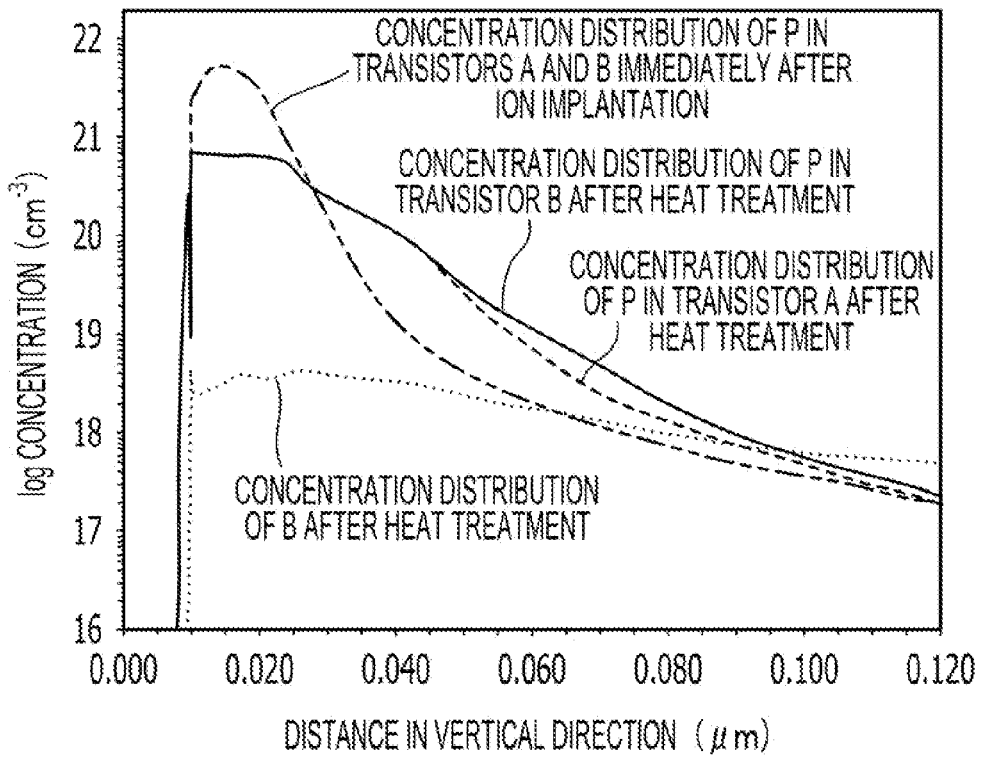
FIG. 3B is a graph illustrating impurity concentration distributions in the vertical direction in the transistors A and B immediately after the impurity implantation and after the activation heat treatment.

FIG. 2A is a chart illustrating an impurity concentration profile in the transistor A after the heat treatment, and FIG. 2B is a chart illustrating an impurity concentration profile in the transistor B after the heat treatment. FIG. 3A is a graph illustrating impurity concentration distributions in the horizontal direction in the transistors A and B immediately after impurity implantation and after the activation heat treatment. A horizontal axis in FIG. 3A represents the distance from the gate electrode at a position indicated by a line H in FIGS. 2A and 2B. A vertical axis in FIG. 3A represents the impurity concentration. FIG. 3B is a graph illustrating impurity concentration distributions in the vertical direction in the transistors A and B immediately after the impurity implantation and after the activation heat treatment. A horizontal axis in FIG. 3B represents the depth from the surface of the semiconductor substrate at a position indicated by a line V in FIGS. 2A and 2B. A vertical axis in FIG. 3B represents the impurity concentration.

It is here assumed that the distance Wa from the sidewall spacer 15a in the transistor A to the device separation region 16 is 100 nm, and the distance Wb from the sidewall spacer 15b in the transistor B to the device separation region 16 is 1000 nm. Further, B (boron) is ion-implanted as channel impurities into the semiconductor substrate. Still further, P (phosphorous) is ion-implanted into the source/drain regions 14a and 14b. The widths of the gate electrodes 12a and 12b, e.g., the gate lengths, are each 45 nm, and the widths of the sidewall spacers 15a and 15b are each 38 nm. The position of a pn-junction is represented by a position indicated by a dotted line in each of FIGS. 2A and 2B and by a position at which the concentration of B (boron) and the concentration of P (phosphorous) are substantially equal to each other in FIGS. 3A and 3B. The width of the sidewall spacer represents the distance from an inner side to an outer side of the sidewall spacer when the MOS transistor is viewed from above.

As seen from FIGS. 3A and 3B, the diffusion distance of the impurities in the transistor B having the larger source/drain regions is larger than that in the transistor A having the smaller source/drain regions.

Figure 4:
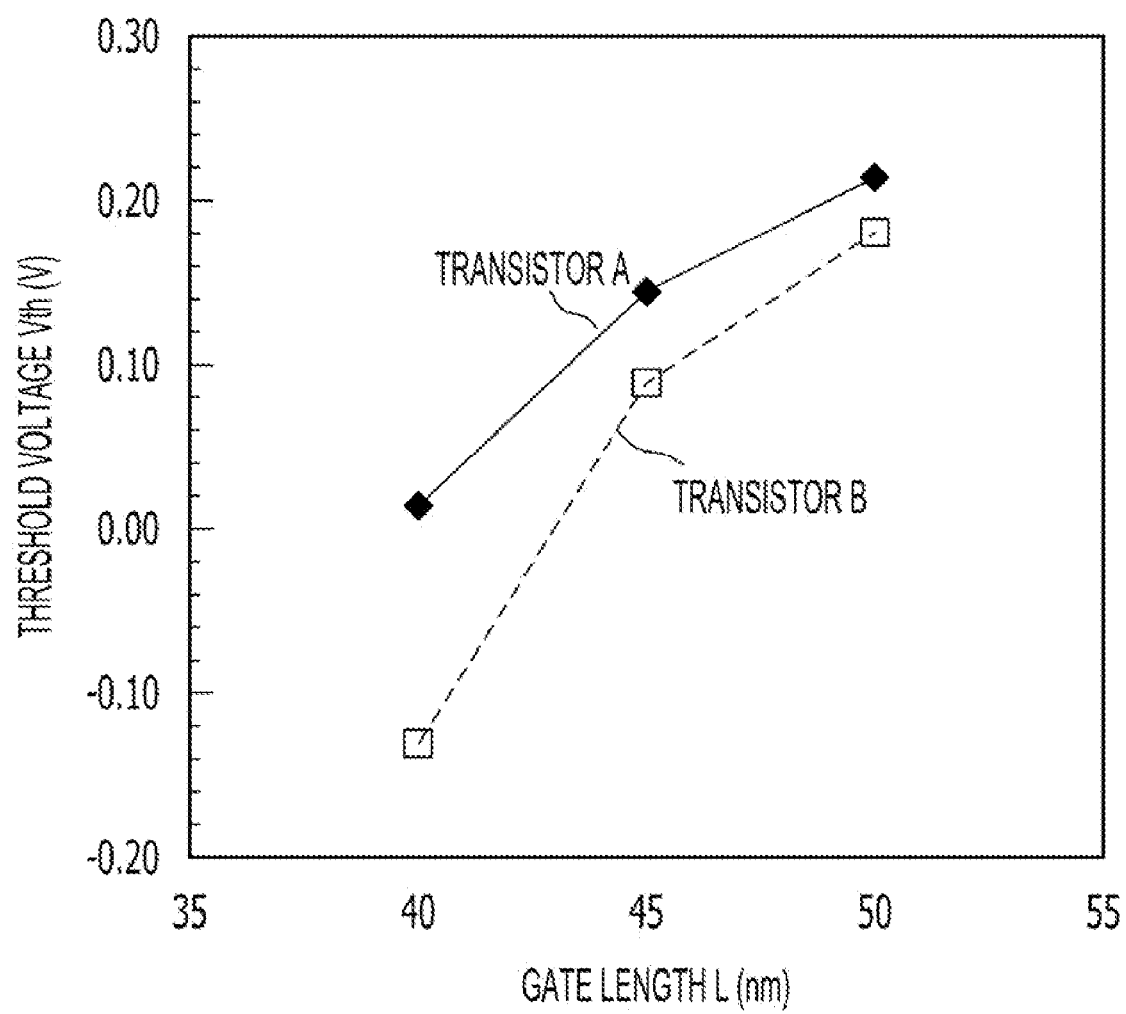
FIG. 4 is a graph illustrating the relationship between a threshold voltage Vth and a gate length L in each of the transistors A and B.

FIG. 4 is a graph illustrating the relationship between a threshold voltage Vth and a gate length L in each of the transistors A and B. In FIG. 4, a horizontal axis represents the gate length L, and a vertical axis represents the threshold voltage Vth. As seen from FIG. 4, when the gate length L is about 50 nm, the difference in the threshold voltage between the transistors A and B is comparatively small. However, as the gate length L reduces, the difference in the threshold voltage between the transistors A and B increases.

The reasons for increasing the diffusion distance of the impurities during the heat treatment in the larger source/drain region have not yet been fully explained. These reasons are explained next. Impurity ions implanted into the semiconductor substrate move in pair with point defects in crystals toward the side where the impurity concentration is lower. When the source/drain region is large, a total number of the impurity ions and the point defects is large and so is the amount of impurities moving in pair with the point defects. Further, in a portion of the source/drain region near the device separation region, the impurities are taken into the device separation region and the density of the impurities is reduced. Accordingly, when the source/drain region is small, a proportion of the impurities diffused toward the device separation region is increased and a proportion of the impurities diffused toward a zone under the gate electrode is relatively reduced. For those reasons, even when the impurity concentration is the same, the diffusion distance of the impurities toward the zone under the gate electrode differs depending on the size of the source/drain region.

FIG. 5 is a top plan view of a semiconductor device according to a first embodiment. The first embodiment is described in connection with the case where two types of n-type MOS transistors A and B having difference sizes of the source/drain regions are formed as illustrated in FIG. 5. It is here assumed that Wa representing the size of the source/drain region, e.g., the source/drain width, in the transistor A is 100 nm, and Wb representing the size of the source/drain region in the transistor B is 1000 nm. The gate length L is 45 nm in each of the transistors A and B, and the gate width W is 160 nm in each of the transistors A and B.

When manufacturing the semiconductor device illustrated in FIG. 5, if the heat treatment is performed under conditions adapted for the transistor A having the smaller source/drain region, the diffusion distance of the impurities implanted into the transistor B having the larger source/drain region is increased too and the desired channel length may not be obtained. To cope with such a problem, in this first embodiment, sidewall spacers 32a are formed on both sides of a gate electrode 29a in the transistor A, while sidewall spacers 33b are formed on both sides of a gate electrode 29b in the transistor B in addition to sidewall spacers 32b each having the same width as that of the sidewall spacer 32a.

FIGS. 6A, 6B, 7A, 7B, 8A, 8B, 9A, 9B, 10A, 10B, 11A, 11B, 12A, 12B, 13A, 13B, and 14 are sectional views illustrating a method of manufacturing the semiconductor device according to the first embodiment in order of successive operations. The semiconductor device includes an n-type MOS transistor and a p-type MOS transistor. The n-type MOS transistor and the p-type MOS transistor are formed through basically similar steps except that the conductivity types of impurities introduced into the semiconductor substrate differ from each other. Therefore, description of a method of manufacturing the p-type MOS transistor is omitted here.

As illustrated in FIG. 6A, a p-type silicon semiconductor substrate 20 having a resistivity of 10 Ωcm is prepared and the surface of the semiconductor substrate 20 is thermally oxidized to form a thermally-oxidized film 21 in a thickness of, e.g., 10 nm. Then, a silicon nitride film 22 is formed on the thermally-oxidized film 21 in a thickness of, e.g., 90 nm by the Chemical Vapor Deposition (CVD) process.

Operations until obtaining the structure illustrated in FIG. 6B will be described below. After forming the silicon nitride film 22 through the above-described operations, a photoresist film is formed on the silicon nitride film 22. Then, exposure and development processes are performed to leave the photoresist film on the silicon nitride film 22 that is positioned on each device region. Further, the silicon nitride film 22 and the thermally-oxidized film 21 are etched away with the photoresist film being used as a mask, wherein the surface of the semiconductor substrate 20 is exposed.

The semiconductor substrate 20 is etched up to a depth of about 260 nm to 350 nm by the dry etching process, thereby forming grooves 23. In this first embodiment, the depth of each groove 23 is set to 280 nm, for example. Then, the photoresist film is removed.

Figure 7A:
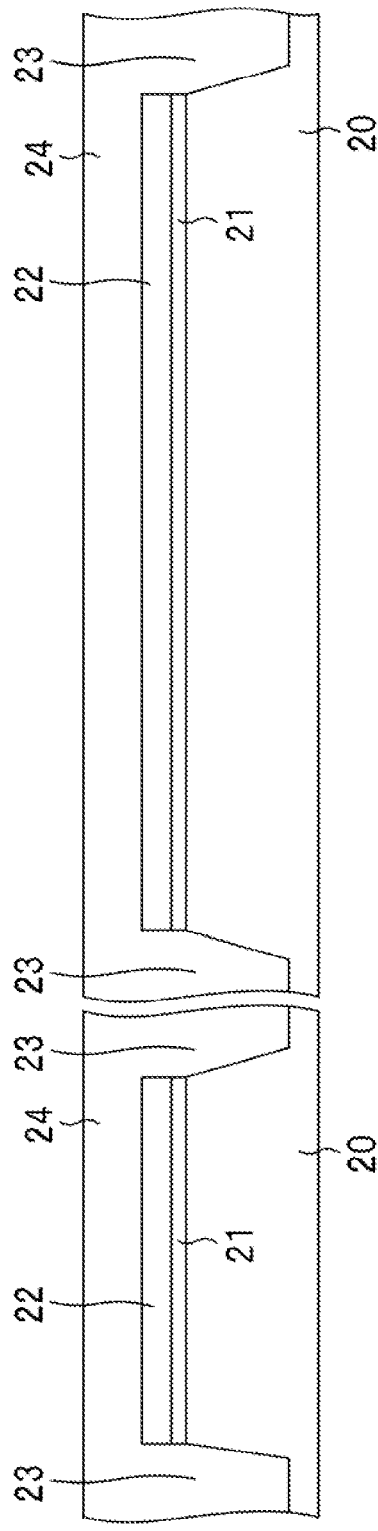
Figure 7B:
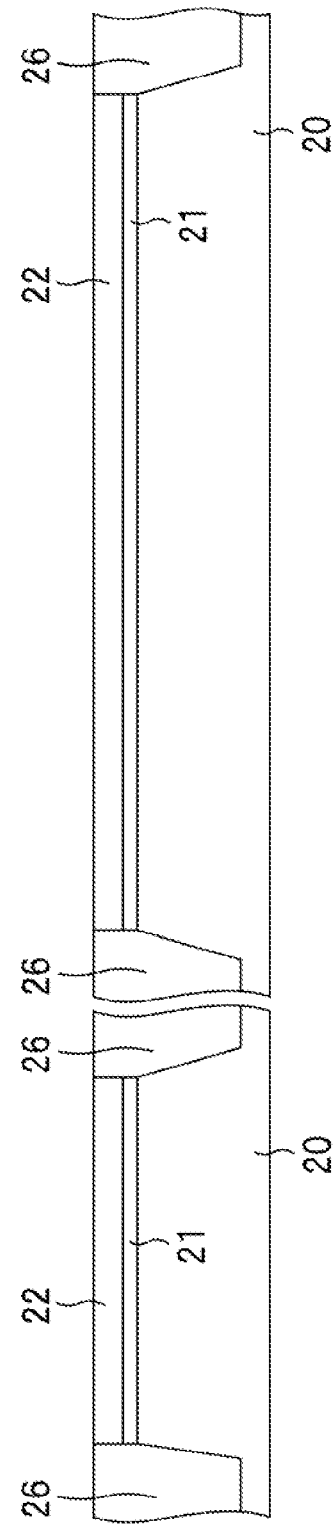

As illustrated in FIG. 7A, a silicon oxide 24 is deposited over the entire surface of the semiconductor substrate 20 by, e.g., the CVD process, wherein the grooves 23 are filled with the silicon oxide 24. Then, as illustrated in FIG. 7B, the silicon oxide 24 is polished by, e.g., the Chemical Mechanical Polishing (CMP) process to such an extent that the silicon nitride film 22 is exposed. Device separation regions 26 are thus formed while the silicon oxide 24 remains in the grooves 23. As illustrated in FIG. 8A, the silicon nitride film 22 and the thermally-oxidized film 21 are removed by, e.g., the dry etching process to make the surface of the semiconductor substrate 20 exposed.

Although the device separation regions 26 are formed by the Shallow Trench Isolation (STI) process in this first embodiment, the device separation regions may be formed by the Local Oxidation of Silicon (LOCOS) process, for example.

Operations until obtaining the structure illustrated in FIG. 8B will be described below. After forming the device separation regions 26 through the above-described steps, the substrate surface in each device region is thermally oxidized to form a sacrifice oxide film in a thickness of, e.g., 10 nm. Then, B (boron) is ion-implanted through the sacrifice oxide film into a region where the n-type MOS transistor is to be formed, thereby forming a p-well. Ion implanting conditions at that time are set, for example, to an acceleration voltage of 120 keV, a dose amount of $3 \times 10^{13}$ cm$^{-2}$, and an irradiation angle of 0°, e.g., irradiation in a direction perpendicular to the substrate surface.

Into the substrate surface of the region where the n-type MOS transistor is to be formed, B (boron) is ion-implanted as channel impurities under conditions of the acceleration voltage of 10 keV, the dose amount of $1.8 \times 10^{13}$ cm$^{-2}$, and the irradiation angle of 7°, for example. The sacrifice oxide film is removed to make the surface of the semiconductor substrate 20 exposed. The ion-implanted impurities are activated by performing heat treatment for 10 sec at temperature of 1000° C. by, e.g., the RTA process.

The substrate surface in each device region is thermally oxidized by the thermal oxidation process to form a gate insulation film 28 in thickness of, e.g., 1.6 nm.

Operations until obtaining the structure illustrated in FIG. 9A will be described below. After forming the gate insulation film 28 through the above-described process, a polysilicon film is formed in a thickness of 90 nm on the gate insulation film 28 by, e.g., the CVD process. A photoresist film is formed on the polysilicon film by the photolithography process, and then the polysilicon film and the gate insulation film 28 are patterned by the dry etching process with the photoresist film being used as a mask. Thereafter, the photoresist film is removed. Gate electrodes 29a and 29b made of polysilicon, for example, illustrated in FIG. 9A, are formed in such a manner.

Operations until obtaining the structure illustrated in FIG. 9B will be described below. Pocket regions 30a and 30b are formed after forming the gate electrodes 29a and 29b through the above-described process. The pocket regions 30a and 30b are formed, by way of example, as follows. In (indium) is ion-implanted into portions of the semiconductor substrate 20 under respective edges of the gate electrodes 29a and 29b four times in total under conditions of the acceleration energy (voltage) of 70 keV, the dose amount of $8 \times 10^{12}$ cm$^{-2}$, and the irradiation angle of 30°, for example, while the irradiation direction is changed in units of 90°. As a result, the pocket regions 30a and 30b are formed under the edges of the gate electrodes 29a and 29b.

With the gate electrodes 29a and 29b being used as masks, As (arsenic) is shallowly ion-implanted into the semiconductor substrate 20 under the conditions of the acceleration energy (voltage) of 1 keV, the dose amount of $2\times10^{15}$ cm$^{-2}$, and the irradiation angle of 0°, for example, thereby forming extension regions 31*a* and 31*b*.

A silicon nitride film is formed in a thickness of, e.g., 40 nm over the entire upper surface of the semiconductor substrate 20 by the CVD process. The silicon nitride film is etched back, as illustrated in FIG. 10A, to form the sidewall spacers 32*a* and 32*b*, each having a width of, e.g., 38 nm, on both sides of each of the gate electrodes 29*a* and 29*b*. The width of each of the sidewall spacers 32*a* and 32*b* may be controlled depending on the thickness of the silicon nitride film and the conditions in etching back the silicon nitride film.

As illustrated in FIG. 10B, a silicon oxide film 33 is formed in a thickness of, e.g., 8 nm over the entire upper surface of the semiconductor substrate 20 by the CVD process. The silicon oxide film 33 is etched back, as illustrated in FIG. 11A, to form the sidewall spacers 33*a* and 33*b*, each having a width of, e.g., 5 nm, adjacent to the sidewall spacers 32*a* and 32*b*, respectively.

By using the photolithography process, as illustrated in FIG. 11B, a photoresist film 35 is formed to cover a region where the transistor B is to be formed. As illustrated in FIG. 12A, the sidewall spacers 33*a* in a region where the transistor A is to be formed are removed by selective etching that utilizes a difference in etching rate between the silicon nitride film and the silicon oxide film. Thereafter, the photoresist film 35 is removed.

In the above-described example, the sidewall spacers 33*a* and 33*b* are formed on both sides of each of the transistor A and the transistor B and the sidewall spacers 33*a* are removed while leaving the sidewall spacers 33*b*. As an alternative example, the process may be modified such that a photoresist film covering the transistor B is formed in the state illustrated in FIG. 10B, the silicon oxide film 33 covering the transistor A is removed, and the sidewall spacers 33*b* are formed over the transistor B after removing the photoresist film.

With the gate electrodes 29*a* and 29*b* and the sidewall spacers 32*a*, 32*b* and 33*b* being used as masks, as illustrated in FIG. 12B, P (phosphorous) is ion-implanted into the semiconductor substrate 20 under conditions of the acceleration energy (voltage) of 15 keV, the dose amount of $5\times10^{13}$ cm$^{-2}$, and the irradiation angle of 0°, for example. P is further ion-implanted into the semiconductor substrate 20 under conditions of the acceleration energy (voltage) of 8 keV, the dose amount of $10^{16}$ cm$^{-2}$, and the irradiation angle of 0°, for example. As a result, source/drain regions 36*a* and 36*b* are formed respectively on both sides of the gate electrode 29*a* and the sidewall spacers 32*a* and on both sides of the gate electrode 29*b* and the sidewall spacers 32*b* and 33*b* at a depth deeper than the extension regions 31*a* and 31*b* with higher impurity concentrations than them.

Heat treatment is performed at temperature of 1030° for 1 sec by, e.g., the RTA process to activate the impurities that have been implanted into the pocket regions 30*a* and 30*b*, the extension regions 31*a* and 31*b*, and the source/drain regions 36*a* and 36*b*. The RTA process may be practiced, for example, by laser annealing or flash lamp annealing. During such an activation heat treatment step, as illustrated in FIG. 13A, the impurities implanted into the source/drain regions 36*a* and 36*b* are diffused toward the gate electrodes 29*a* and 29*b*, wherein the channel length is shortened.

As described above, the diffusion distance of the impurities changes depending on the size of the source/drain region. In this first embodiment, therefore, the diffusion distance of the impurities is larger in the source/drain region 36*b* than in the source/drain region 36*a*. This means that, if only the sidewall spacer 32*b* having the same width as the sidewall spacer 32*a* in the transistor A is formed in the transistor B and the conditions for the activation heat treatment are set to be adapted for the transistor A, the channel length may be shortened and the so-called channel shortening effect may be generated in the transistor B. In this first embodiment, however, since the sidewall spacers 32*b* and 33*b* are formed on both sides of the gate electrode 29*b* in the transistor B, the impurities may be suppressed from being excessively diffused toward a zone under the gate electrode 29*b*. Accordingly, the generation of the channel shortening effect may be impeded.

Silicide films 37*a*, 37*b*, 37*c* and 37*d* are formed as illustrated in FIG. 13B. The silicide films 37*a*, 37*b*, 37*c* and 37*d* are formed, by way of example, as follows. Co (cobalt) is deposited to form a cobalt film on the entire upper surface of the semiconductor substrate 20 by, e.g., the sputtering process, and heat treatment is then performed on the semiconductor substrate 20. With the heat treatment, the cobalt reacts with the silicon in respective upper portions of the source/drain regions 36*a* and 36*b* and the gate electrodes 29*a* and 29*b*, wherein the silicide films 37*a*, 37*b*, 37*c* and 37*d* are formed. Thereafter, the unreacted cobalt is removed by etching.

Figure 14:
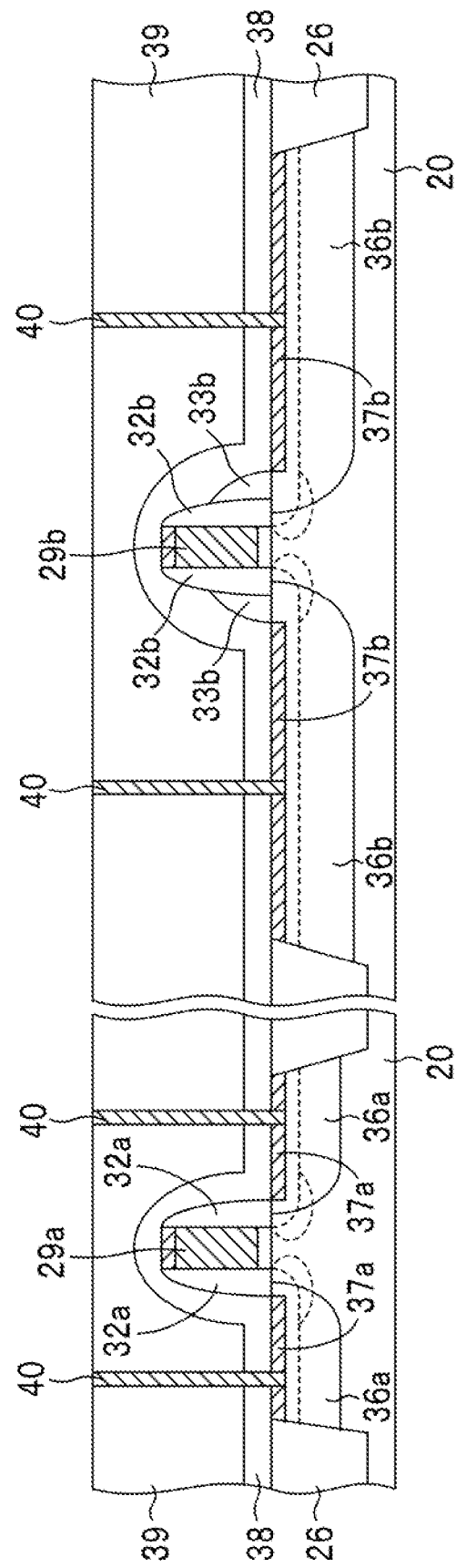

As illustrated in FIG. 14, a silicon nitride film 38 is formed in a thickness of, e.g., 80 nm over the entire upper surface of the semiconductor substrate 20 by the CVD process. An interlayer insulation film 39 made of, e.g., Undoped Silicate Glass (USG) and Tetra-Ethyl-Ortho-Silicate (TEOS), is formed in a thickness of 145 nm by the CVD process. Contact holes extending from an upper surface of the interlayer insulation film 39 so as to reach the silicide films 37*a* and 37*b* on the source/drain regions 36*a* and 36*b* are formed by performing a photolithography step and an etching step.

A Ti film and a TiN film are formed, as an adhesion layer (glue layer), in a thickness of, e.g., 14 nm over the entire upper surface of the semiconductor substrate 20 by the sputtering process, and W (tungsten) is then deposited in a thickness of about 200 nm such that the contact holes are filled with W. Thereafter, the entire surface is flattened by performing the CMP polishing until an upper surface of the interlayer insulation film 39 is exposed. As a result, contact plugs 40 are formed which are electrically connected to the source/drain regions 36*a* and 36*b*. A desired multilayered wiring structure is then formed by successively performing a wiring forming operation, an interlayer insulation film forming operation, a contact plug forming operation, and so on.

Figure 15B:
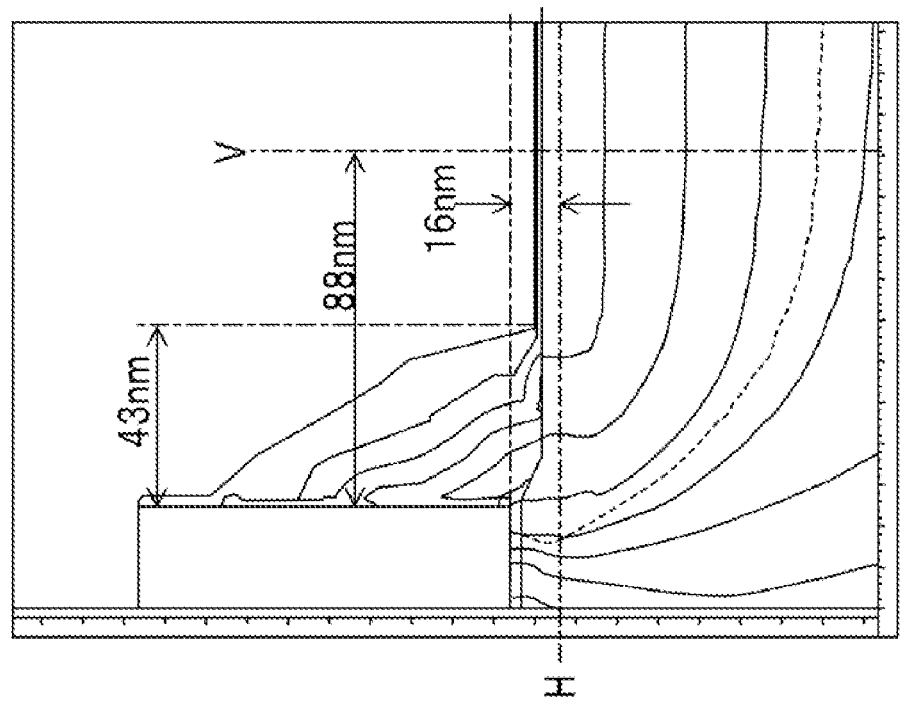
FIG. 15B is a chart illustrating an impurity concentration profile in the transistor B after the heat treatment.
Figure 15A:
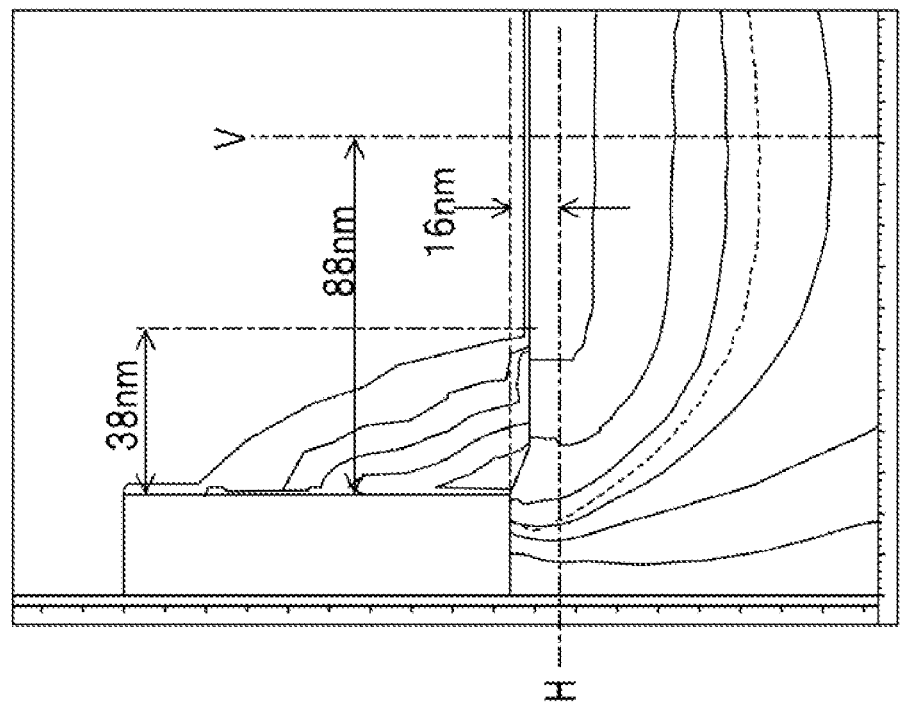
FIG. 15A is a chart illustrating an impurity concentration profile in the transistor A after the heat treatment.
Figure 16A:
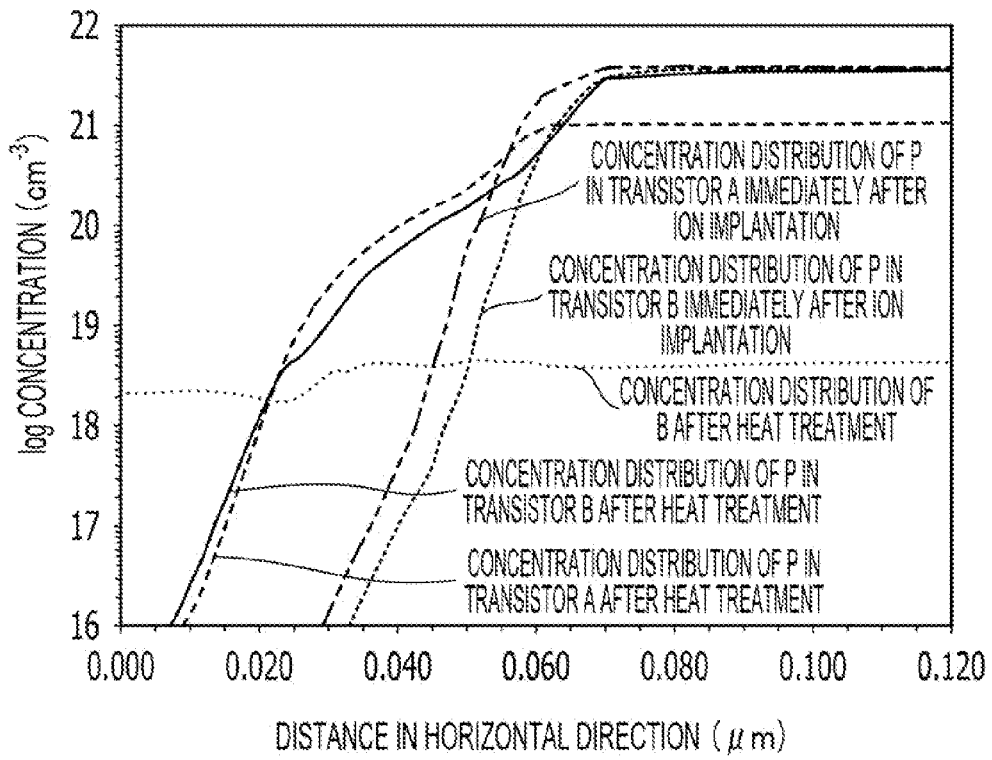
FIG. 16A is a graph illustrating impurity concentration distributions in the horizontal direction in the transistors A and B immediately after the impurity implantation and after the activation heat treatment.
Figure 16B:
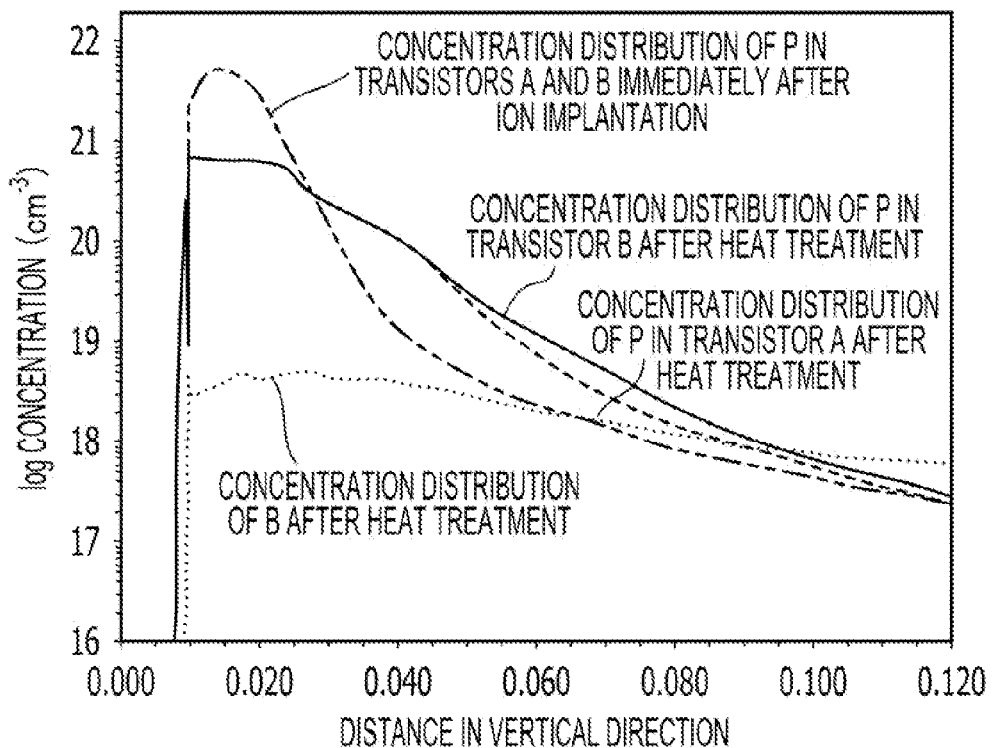
FIG. 16B is a graph illustrating impurity concentration distributions in the vertical direction in the transistors A and B immediately after the impurity implantation and after the activation heat treatment.

FIG. 15A is a chart illustrating an impurity concentration profile in the transistor A after the heat treatment, and FIG. 15B is a chart illustrating an impurity concentration profile in the transistor B after the heat treatment. FIG. 16A is a graph illustrating impurity concentration distributions in the horizontal direction in the transistors A and B immediately after the impurity implantation and after the activation heat treatment. A horizontal axis in FIG. 16A represents the distance from the gate electrode at a position indicated by a line H in FIGS. 15A and 15B. A vertical axis in FIG. 16A represents the impurity concentration. FIG. 16B is a graph illustrating impurity concentration distributions in the vertical direction in the transistors A and B immediately after the impurity implantation and after the activation heat treatment. A horizontal axis in FIG. 16B represents the depth from the surface of the semiconductor substrate at a position indicated by a line V in FIGS. 15A and 15B. A vertical axis in FIG. 16B represents the impurity concentration.

It is here assumed that the distance Wa from the sidewall spacer 32*a* in the transistor A to the device separation region 26 is 100 nm, and the distance Wb from the sidewall spacer 33*b* in the transistor B to the device separation region 26 is 1000 nm. Further, B (boron) is ion-implanted as channel impurities into the semiconductor substrate. Still further, P (phosphorous) is ion-implanted into the source/drain regions 36a and 36b. The widths of the gate electrodes 29a and 29b, e.g., the gate lengths, are each 45 nm. The width of the sidewall spacer 32a in the transistor A is 38 nm, and the total width of the sidewall spacers 32b and 33b in the transistor B is 43 nm, for example. The position of a pn-junction is represented by a position indicated by a dotted line in each of FIGS. 15A and 15B and by a position at which the concentration of B (boron) and the concentration of P (phosphorous) are equal to each other in FIGS. 16A and 16B.

As seen from FIGS. 16A and 16B, the distance between the pn-junction and the edge of the gate electrode after the heat treatment is substantially the same in the transistors A and B that have been manufactured according to the first embodiment.

Figure 17:
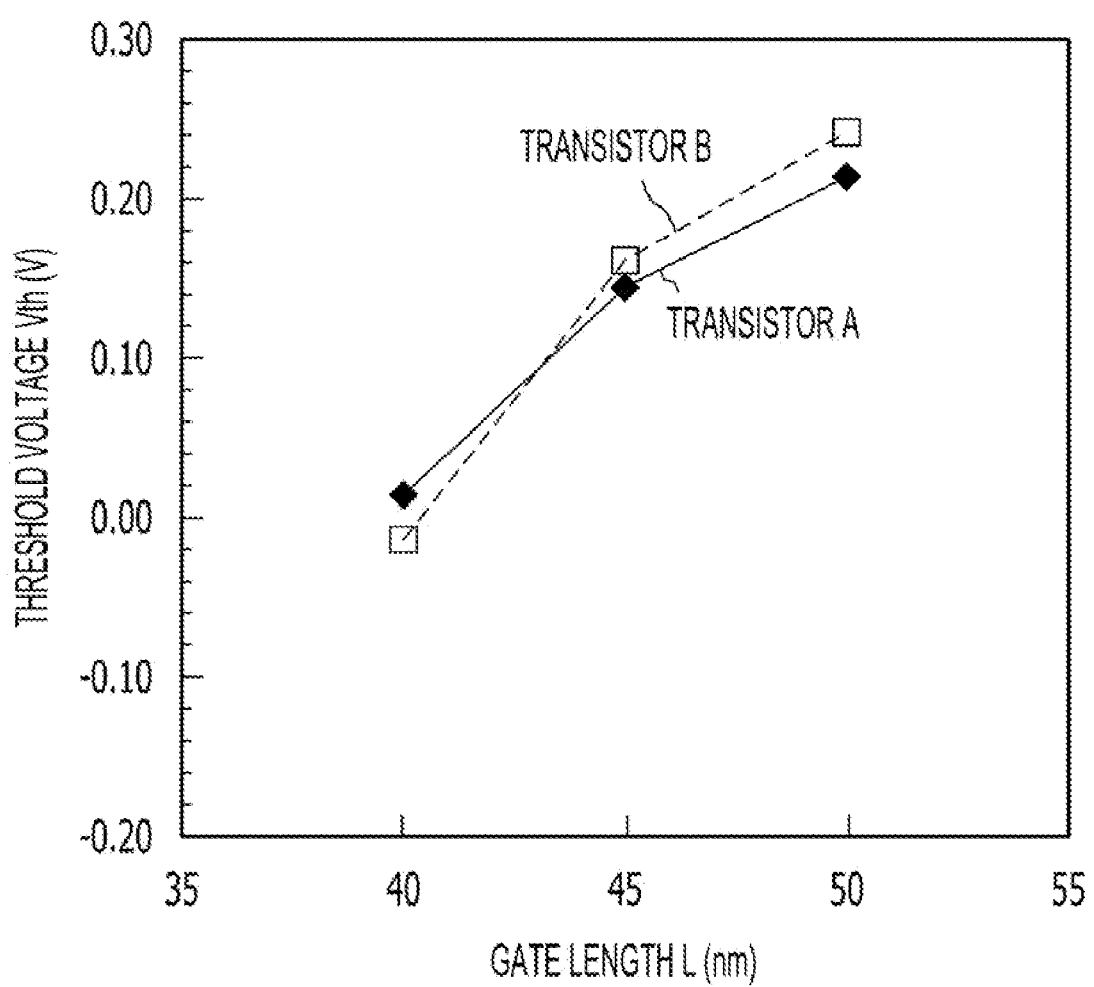
FIG. 17 is a graph illustrating the relationship between the threshold voltage Vth and the gate length L in each of the transistors A and B.

FIG. 17 is a graph illustrating the relationship between a threshold voltage Vth and a gate length L in each of the transistors A and B that have been manufactured according to the first embodiment. In FIG. 17, a horizontal axis represents the gate length L, and a vertical axis represents the threshold voltage Vth. As seen from FIG. 17, in the transistors A and B manufactured according to the first embodiment, the threshold voltage is substantially the same over the range from 40 nm to 50 nm of the gate length.

While the width of the sidewall spacer 32a in the transistor A is 38 nm and the total width of the sidewall spacers 32b and 33b in the transistor B is 43 nm in this first embodiment, those values are given by way of example. Preferably, the widths of the sidewall spacers in the transistors A and B are set by executing simulation calculations of the impurity concentration distributions after the heat treatment with, for example, the sizes of the source/drain regions 36a and 36b being parameters, and by determining the widths of the sidewall spacers such that characteristics of the transistors A and B substantially match with each other, or that the difference in the characteristics falls within an allowable range.

Figure 18:
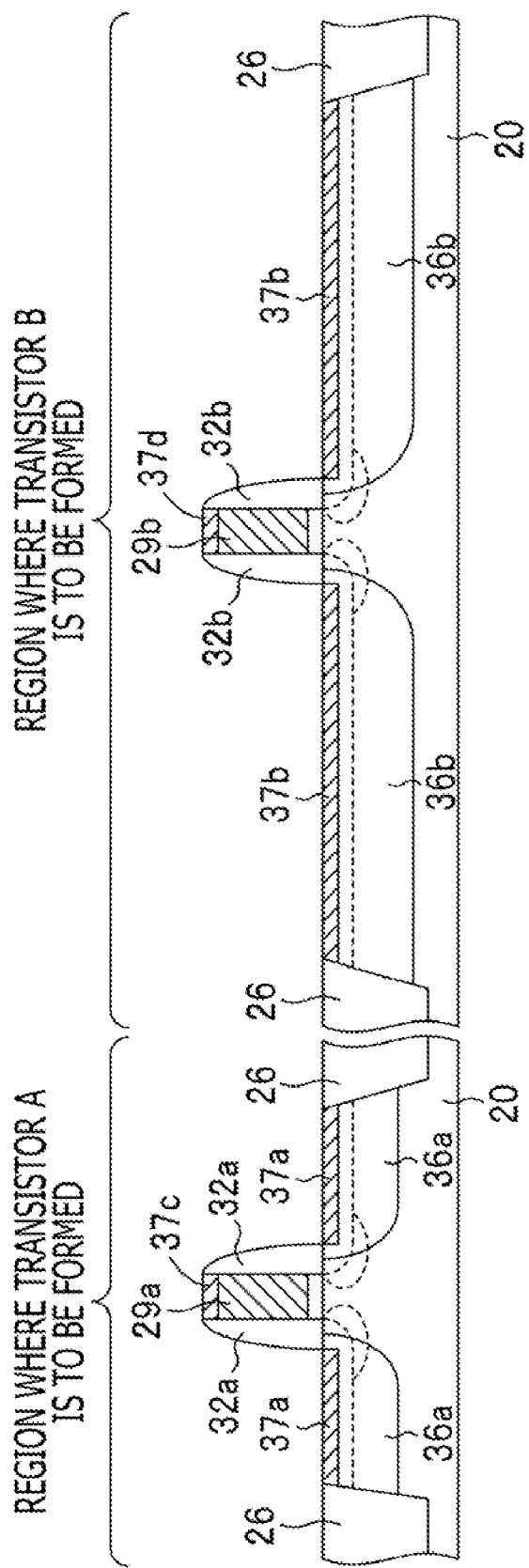
FIG. 18 is a sectional view of a semiconductor device according to a modification of the first embodiment.

In the first embodiment, as illustrated in FIGS. 12B, 13A and 13B, after ion-implanting P (phosphorous) into the semiconductor substrate 20, the silicide films 37b, e.g. are formed while the sidewall spacers 33b remain in the region where the transistor B is to be formed. Alternatively, as illustrated in FIG. 18, the silicide forming step may be carried out in a state that the sidewall spacers 33b in the region where the transistor B is to be formed have been removed, after the ion-implantation of P or after the activation heat treatment. Such a modification is advantageous in that, as illustrated in FIG. 18, an area of each silicide film 37b in contact with the source/drain region 36b is increased and an apparent resistance value of the source/drain region 36b is reduced.

Figure 19:
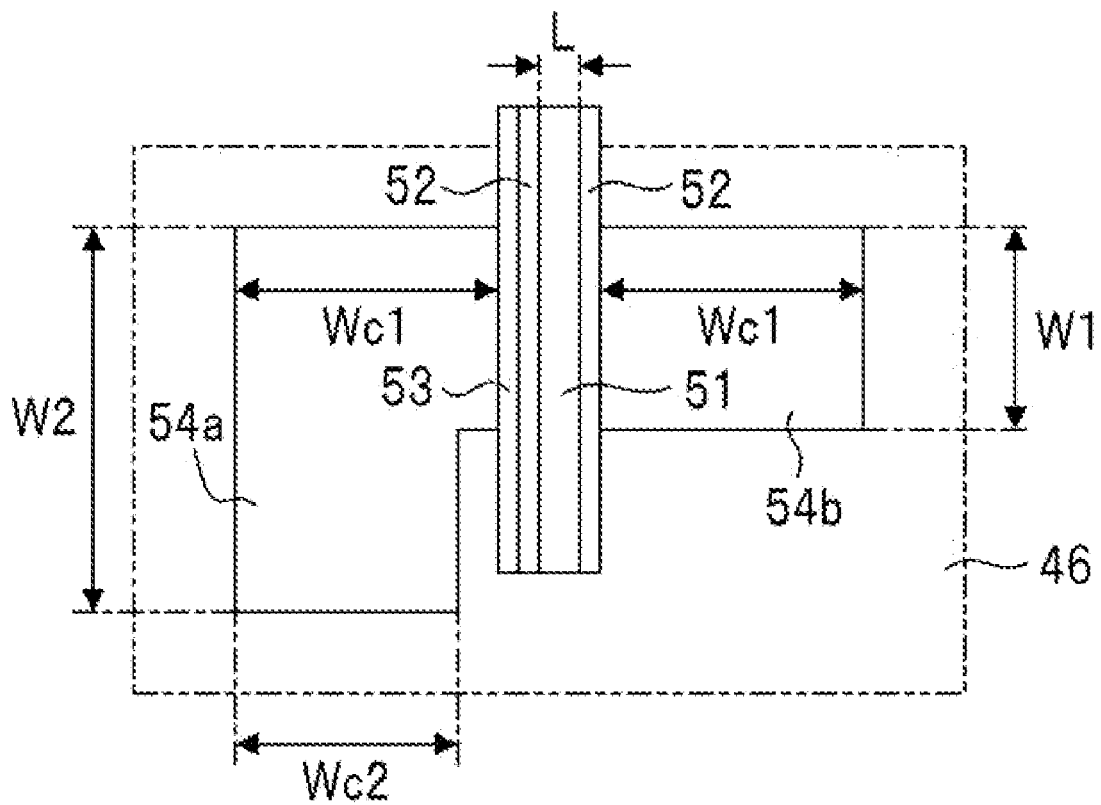
FIG. 19 is a top plan view of a semiconductor device according to a second embodiment.

FIG. 19 is a top plan view of a MOS transistor according to a second embodiment. The second embodiment is described below in FIG. 19, a pair of source and drain regions disposed on both sides the gate electrode have sizes differing from each other. In the second embodiment, as illustrated in FIG. 19, a source/drain region 54a on the left side of a gate electrode 51 has an L-shape, and a source/drain region 54b on the right side of the gate electrode 51 has a rectangular shape. It is assumed in FIG. 19 that the gate length L is 45 nm, a length denoted by W1 is 160 nm, a length denoted by W2 is 240 nm, a length denoted by Wc1 is 300 nm, and a length denoted by Wc2 is 280 nm, for example.

More specifically, in a transistor illustrated in FIG. 19, a length Wc1 from a second sidewall spacer 53 on the left side of the gate electrode 51 to a device separation region and a length Wc1 from a first sidewall spacer 52 on the right side of the gate electrode 51 to the device separation region are each 300 nm, for example. Areas of the source/drain regions 54a and 54b differ from each other. In such a case, impurities ion-implanted into the source/drain region 54a having the larger area are diffused through a larger distance during the heat treatment in comparison with impurities ion-implanted into the source/drain region 54b having the smaller area. In view of the above point, only the first sidewall spacer 52 is disposed on the right side of the gate electrode 51, and the second sidewall spacer 53 is disposed on the left side of the gate electrode 51 in addition to the first sidewall spacer 52.

FIGS. 20A, 20B, 21A, 21B, and 21C are sectional views illustrating a method of manufacturing the semiconductor device according to the second embodiment in order of successive operations.

Figure 20A:
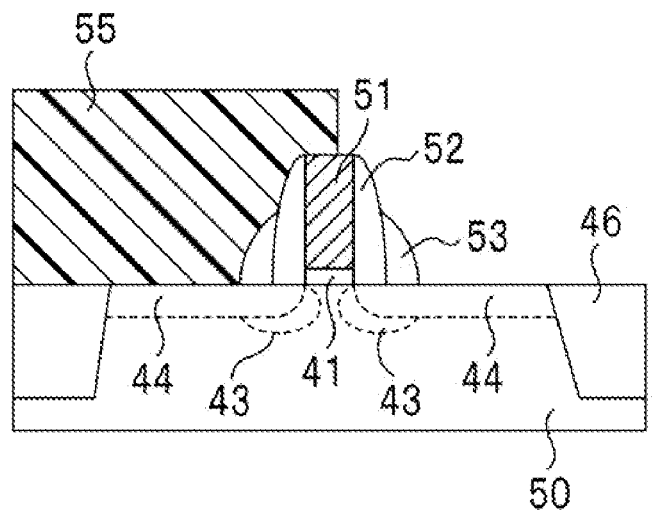
FIGS. 20A, 20B, 21A, 21B, and 21C are sectional views illustrating a method of manufacturing the semiconductor device according to the second embodiment.

As illustrated in FIG. 20A, a device separation region 46, a gate insulation film 41, the gate electrode 51, pocket regions 43, extension regions 44, the (first) sidewall spacers 52, and the (second) sidewall spacers 53 are formed on a semiconductor substrate 50 in a similar manner to that in the first embodiment. Operations until obtaining such a state are similar to those illustrated in FIGS. 6A, 6B, 7A, 7B, 8A, 8B, 9A, 9B, 10A, 10B and 11A. In this second embodiment, it is assumed that the sidewall spacers 52 are each formed of a silicon nitride film having a width of 38 nm, for example. Also, for example, the sidewall spacers 53 are each formed of a silicon oxide film having a width of 5 nm.

After coating a photoresist over the entire upper surface of the semiconductor substrate 50, exposure and development processes are performed to form a photoresist film 55 covering a zone where the source/drain region is to be formed on the left side of the gate electrode 51.

Figure 20B:
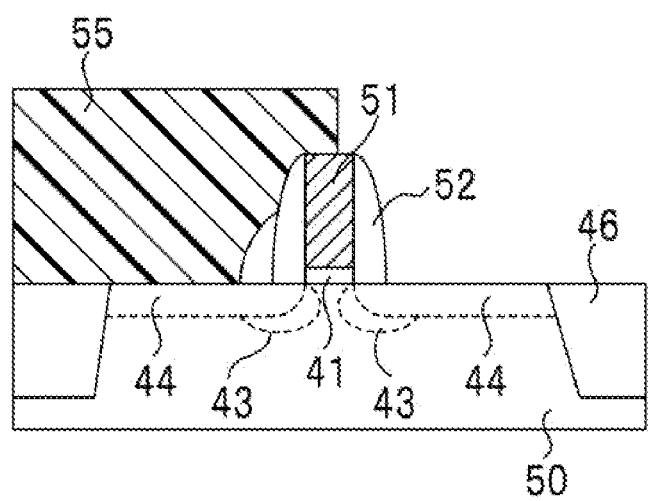

As illustrated in FIG. 20B, the sidewall spacer 53 on the right side of the gate electrode is removed by etching with the photoresist film 55 being used as a mask. Thereafter, the photoresist film 55 is removed.

Figure 21A:
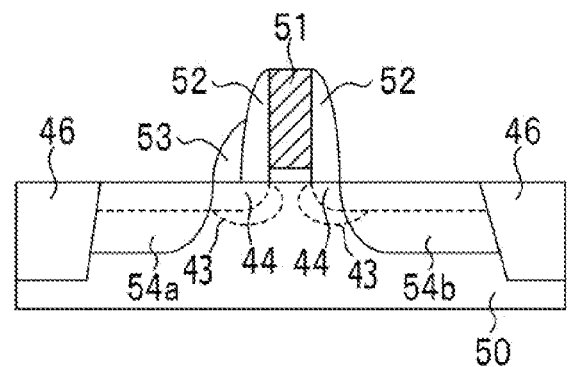
Figure 21B:
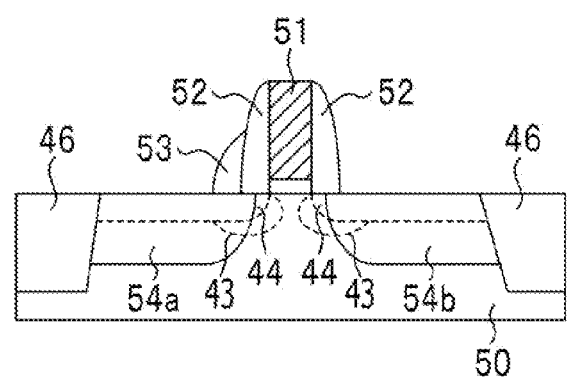

As illustrated in FIG. 21A, P (phosphorous) is ion-implanted into the semiconductor substrate 50 with the gate electrode 51 and the sidewall spacers 52 and 53 being used as masks, thereby forming the source/drain regions 54a and 54b. Heat treatment is performed at temperature of 1030° for 1 sec by, e.g., the RTA process to activate the impurities that have been implanted into the pocket regions 43, the extension regions 44, and the source/drain regions 54a and 54b.

During the activation heat treatment operation described above, as illustrated in FIG. 21B, the impurities implanted into the source/drain regions 54a and 54b are diffused such that the source/drain region 54a and 54b come closer to the gate electrode 51. On that occasion, the diffusion distance of the impurities is larger in the source/drain region 54a having the larger area than in the source/drain region 54b having the smaller area. In this second embodiment, however, since the sidewall spacer 53 is formed on the same side as the source/drain region 54a in addition to the sidewall spacer 52, the distances from the gate electrode 51 to the source/drain region 54a and 546b are substantially equal to each other.

Figure 21C:
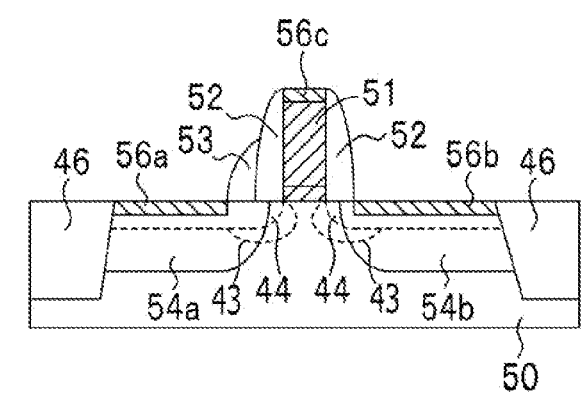
Figure 22:
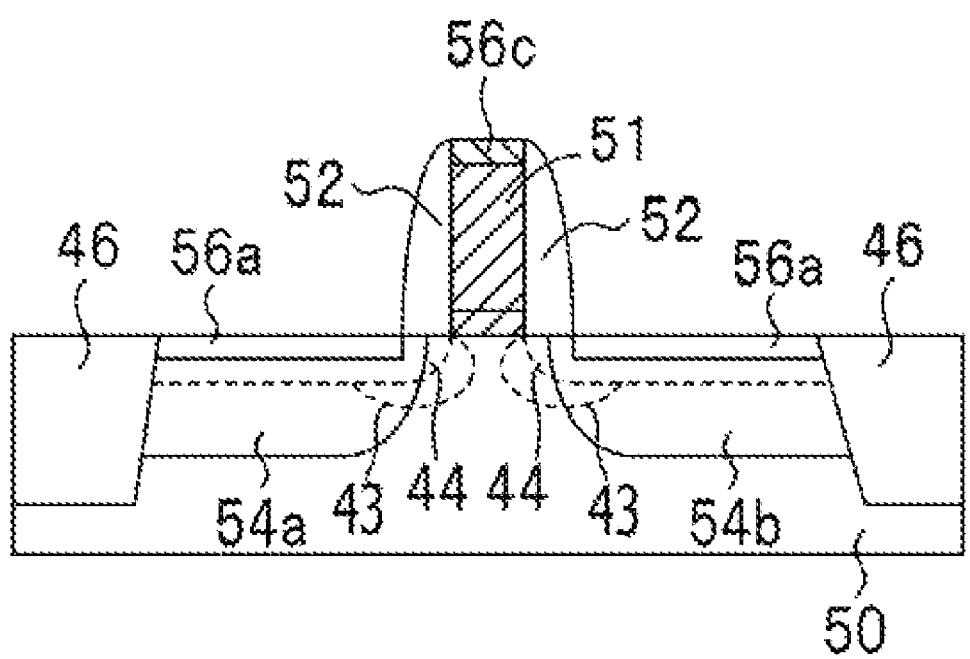
FIG. 22 is a sectional view of a semiconductor device according to a modification of the second embodiment.

As illustrated in FIG. 21C, silicide films 56a, 56b and 56c are formed respectively on the source/drain regions 54a and 54b and the gate electrode 51. Alternatively, as illustrated in FIG. 22, the silicide films 56a, for example, may be formed after removing the sidewall spacer 53 on the same side as the source/drain region 54a. A subsequent operation of forming a multilayered wiring structure is similar to that in the first embodiment, and hence description of that operation is omitted here.

The second embodiment may also hinder excessive diffusion of the impurities into a zone under the gate electrode 51 and provide desired transistor characteristics as in the first embodiment.

Figure 23:
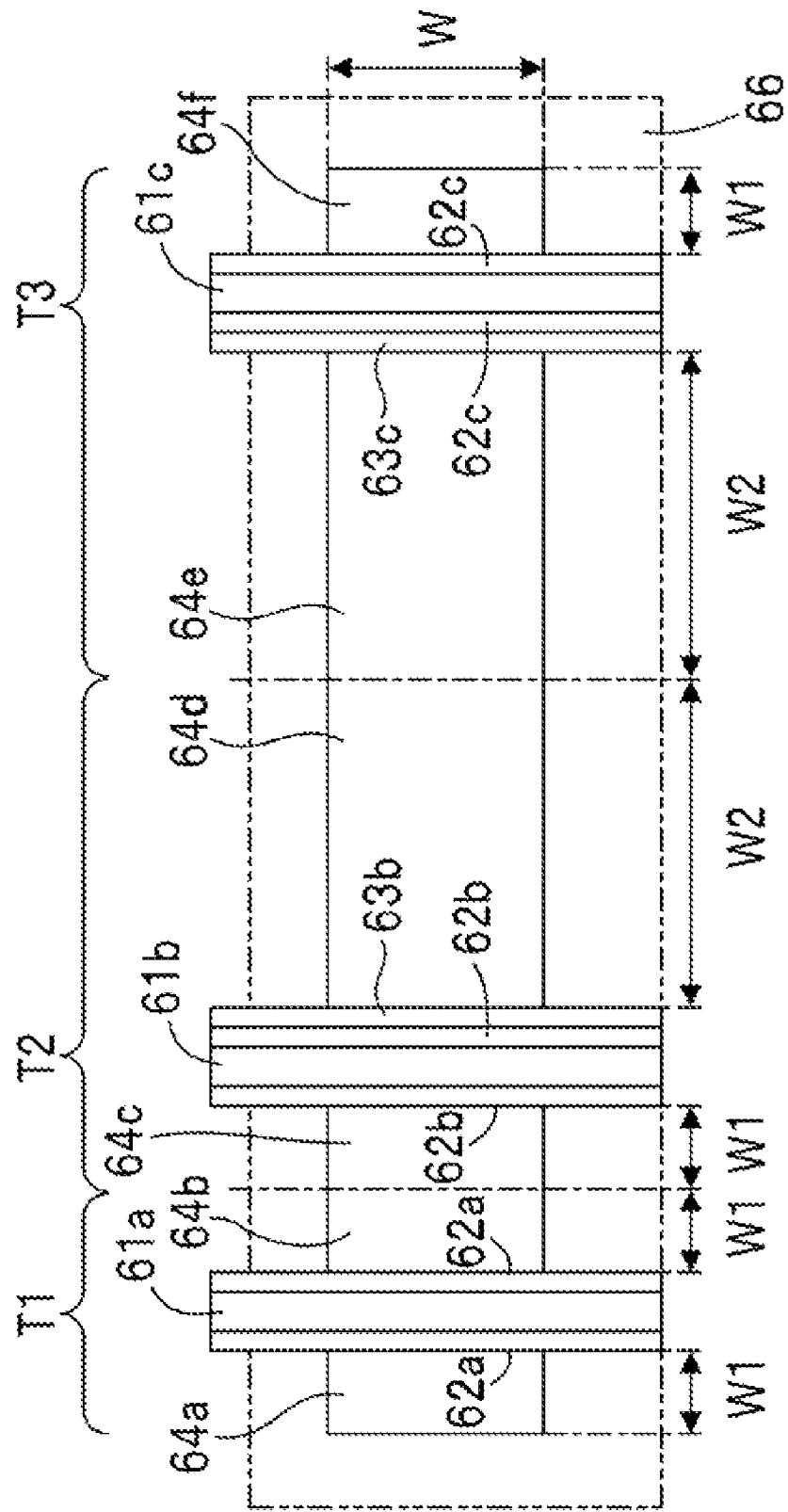
FIG. 23 is a top plan view of a semiconductor device according to a third embodiment.

FIG. 23 is a top plan view of a semiconductor device according to a third embodiment. In the third embodiment, as illustrated in FIG. 23, three transistors T1, T2 and T3 are formed in one rectangular device region surrounded by a device separation region 66. The source/drain widths on both sides of a gate electrode 61*a* of the transistor T1 are each W1. Also, the source/drain width on the left side of a gate electrode 61*b* of the transistor T2 is W1, and the source/drain width on the right side of the gate electrode 61*b* is W2 (W1<W2). Further, the source/drain width on the left side of a gate electrode 61*c* of the transistor T3 is W2, and the source/drain width on the right side of the gate electrode 61*c* is W1. Each of the transistors T1, T2 and T3 has a gate width W, for example.

The source/drain width represents the distance from a sidewall spacer to the device separation region when no other gate electrodes are present between the gate electrode and the device separation region as in the first and second embodiments. When a plurality of transistors are formed in one device region as in this third embodiment, the source/drain width also represents the distance from a midpoint between respective sidewall spacers of the adjacent transistors to each of the sidewall spacer.

In the following description, a region from a sidewall spacer 62*a* on the left side in the transistor T1 to the device separation region 66 is called a source/drain region 64*a*, and a region from a sidewall spacer 62*a* on the right side in the transistor T1 to a midpoint between the transistors T1 and T2 (e.g., a midpoint between respective sidewall spacers of those transistors; this is similarly applied to the term "midpoint" appearing below) is called a source/drain region 64*b*. A region from a sidewall spacer 62*b* on the left side in the transistor T2 to the midpoint between the transistors T1 and T2 is called a source/drain region 64*c*, and a region from sidewall spacers 62*b* and 63*b* on the right side in the transistor T2 to a midpoint between the transistors T2 and T3 is called a source/drain region 64*d*. A region from sidewall spacers 62*c* and 63*c* on the left side in the transistor T3 to the midpoint between the transistors T2 and T3 is called a source/drain region 64*e*, and a region from a sidewall spacer 62*c* on the right side in the transistor T3 to the device separation region 66 is called a source/drain region 64*f*.

In the semiconductor device illustrated in FIG. 23, areas of the source/drain regions 64*d* and 64*e* differ from areas of the other source/drain regions 64*a*, 64*b*, 64*c* and 64*f*. In such a case, impurities ion-implanted into the source/drain regions 64*d* and 64*e* having the larger areas are diffused through larger distances during the heat treatment in comparison with impurities ion-implanted into the source/drain regions 64*a*, 64*b*, 64*c* and 64*f* having the smaller areas.

In this third embodiment, the sidewall spacers 62*a*, 62*b* and 62*c*, which are formed by etching back silicon nitride films, are disposed on both sides of each of the gate electrode 61*a*, 61*b* and 61*c* of the transistors T1, T2 and T3, respectively. Further, the sidewall spacers 63*b* and 63*c*, which are formed by etching back silicon oxide films, are disposed on the right side of the gate electrode 61*b* of the transistor T2 and on the left side of the gate electrode 61*c* of the transistor T3, respectively. With such an arrangement, the distances from the gate electrodes 61*b* and 61*c* to the source/drain regions 64*d* and 64*e* are increased and the impurities are hindered from being excessively diffused into zones under the gate electrodes 61*b* and 61*c* from the source/drain regions 64*d* and 64*e* during the activation heat treatment. As a result, desired characteristics may be obtained.

The semiconductor device according to the third embodiment may be manufactured substantially in a similar manner to that in the second embodiment except for forming a plurality of transistors on one device region. More specifically, the sidewall spacers made of silicon nitride films and the sidewall spacers made of silicon oxide films are formed on both sides of each of the gate electrode 61*a*, 61*b* and 61*c* of the transistors T1, T2 and T3, which share one common device region. Then, the sidewall spacers made of silicon oxide films and positioned on both sides of the gate electrode 61*a*, on the right side of the gate electrode 61*b*, and on the left side of the gate electrode 61*c* are removed by the photolithography process and the etching process.

Figure 24:
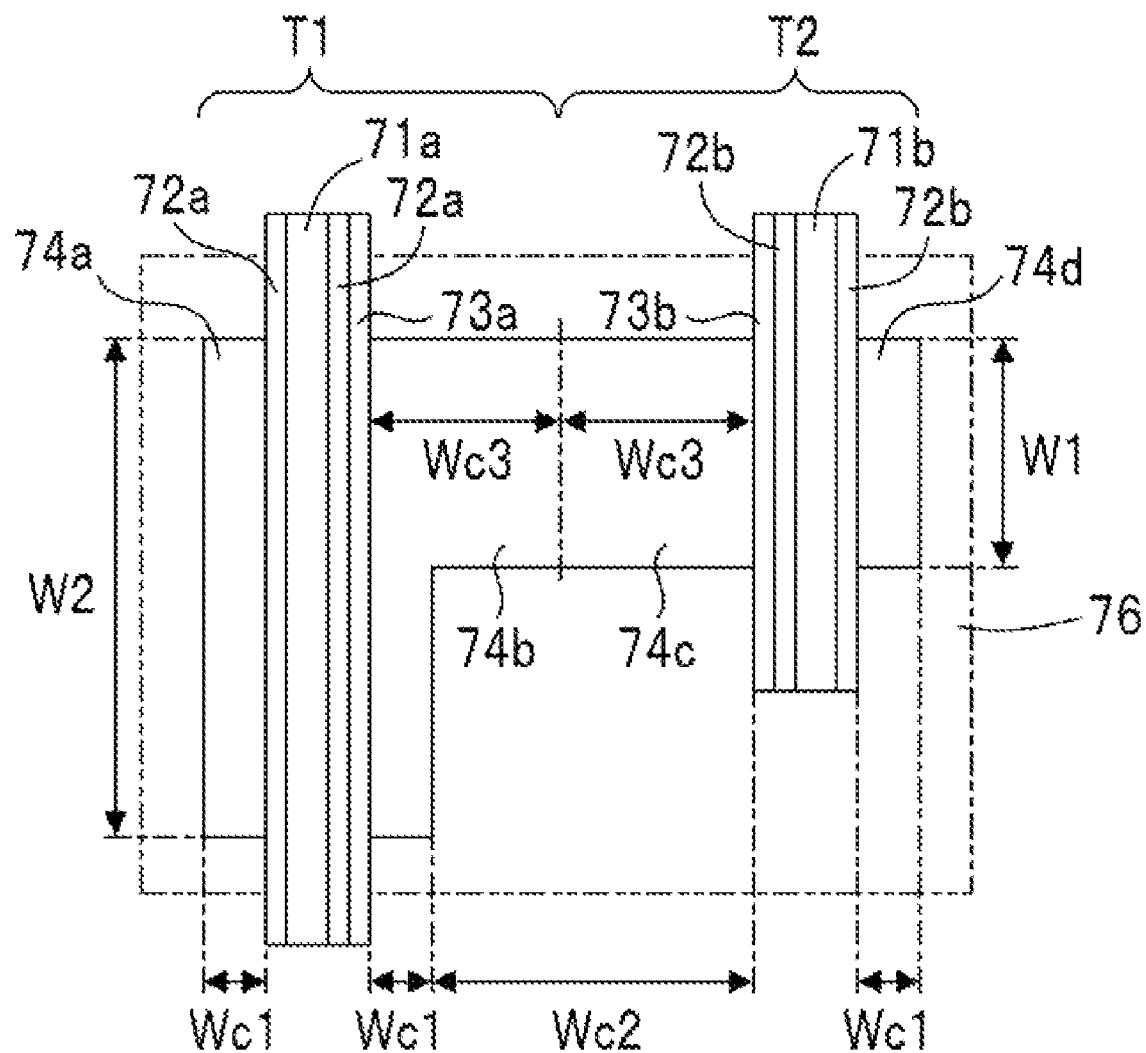
FIG. 24 is a top plan view of a semiconductor device according to a fourth embodiment.

FIG. 24 is a top plan view of a semiconductor device according to a fourth embodiment. In the fourth embodiment, as illustrated in FIG. 24, two transistors T1 and T2 are formed while sharing one common L-shaped device region surrounded by a device separation region 76. A source/drain region 74*a* on the left side of a gate electrode 71*a* of the transistor T1 has a rectangular shape, but a source/drain region 74*b* on the right side of the gate electrode 71*a* has an L-shape and has a larger area than the source/drain region 74*a* on the left side. Further, in the transistor T2, a source/drain region 74*c* on the left side of a gate electrode 71*b* has a larger area than a source/drain region 74*d* on the right side of the gate electrode 71*b*.

The gate width of the transistor T1 is W2. The source/drain width of the source/drain region 74*a* on the left side in the transistor T1 is Wc1, and the source/drain region 74*b* on the right side in the transistor T1 includes two portions, e.g., one having a source/drain width Wc1 and the other having a source/drain width Wc3 (Wc1<Wc3). The gate width of the transistor T2 is W1 (W1<W2). The source/drain width of the source/drain region 74*c* on the left side in the transistor T2 is Wc3, and the source/drain width of the source/drain region 74*d* on the right side in the transistor T2 is Wc1. Further, in this fourth embodiment, a region from sidewall spacers 72*a* and 73*a* on the right side of the gate electrode 71*a* of the transistor T1 to a midpoint between the transistors T1 and T2 is called the source/drain region 74*b* on the transistor T1 side. A region from sidewall spacers 72*b* and 73*b* on the left side of the gate electrode 71*b* of the transistor T2 to the midpoint between the transistors T1 and T2 is called the source/drain region 74*c* on the transistor T2 side.

In the semiconductor device illustrated in FIG. 24, areas of the source/drain regions 74*b* and 74*c* larger than those of the other source/drain regions 74*a* and 74*d*. In such a case, impurities ion-implanted into the source/drain regions 74*b* and 74*c* having the larger areas are diffused through larger distances during the heat treatment in comparison with impurities ion-implanted into the source/drain regions 74*a* and 74*d* having the smaller areas.

In this fourth embodiment, only the sidewall spacer 72*a* is disposed on the left side of the gate electrode 71*a* of the transistor T1, and the sidewall spacers 72*a* and 73*a* are disposed on the right side of the gate electrode 71*a*. Further, the sidewall spacers 72*b* and 73*b* are disposed on the left side of the gate electrode 71*b* of the transistor T2, and only the sidewall spacer 72*b* is disposed on the right side of the gate electrode 71*b*. With such an arrangement, the distances from the gate electrodes 71*a* and 71*b* to the source/drain regions 74*b* and 74*c* are increased and the impurities are hindered from being excessively diffused into zones under the gate electrodes 71*a* and 71*b* from the source/drain regions 74*b* and 74c during the activation heat treatment. As a result, desired characteristics may be obtained.

The widths of the sidewall spacers in the transistors T1 and T2 are set by executing simulation calculations of the impurity concentration distributions after the heat treatment with the sizes of the source/drain regions 74a and 74d being parameters, and by determining the widths of the sidewall spacers such that characteristics of the transistors T1 and T2 substantially match with each other, or that the difference in the characteristics falls within an allowable range.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A semiconductor device comprising:
    a first transistor of a first conductivity type including,
        a first gate electrode having a first width,
        a first sidewall spacer formed on a sidewall of the first gate electrode and having a second width,
        a first channel region formed in a semiconductor substrate under the first gate electrode, and
        a first source/drain region formed in the semiconductor substrate; and
    a second transistor of the first conductivity type including,
        a second gate electrode having a third width,
        a second sidewall spacer formed on a sidewall of the second gate electrode and having a fourth width wider than the second width,
        a second channel region formed in the semiconductor substrate under the second gate electrode, and
        a second source/region formed in the semiconductor substrate,
    wherein a first length of the first source/drain region in a direction perpendicular to the first gate electrode is shorter than a second length of the second source/drain region in a direction perpendicular to the second gate electrode, and impurity concentrations in the first source/drain region are substantially equal to impurity concentrations in the second source/drain region.

2. The semiconductor device according to claim 1, wherein the first width and the third width are substantially the same.

3. The semiconductor device according to claim 1, wherein the first width and the third width are less than or equal to 50 nm.

* * * * *